US010955760B2

(12) United States Patent
Nakano et al.

(10) Patent No.: US 10,955,760 B2
(45) Date of Patent: Mar. 23, 2021

(54) EXTREME ULTRAVIOLET LIGHT GENERATION DEVICE AND TARGET SUPPLY DEVICE

(71) Applicant: Gigaphoton Inc., Tochigi (JP)

(72) Inventors: Masaki Nakano, Oyama (JP); Yutaka Shiraishi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/812,831

(22) Filed: Mar. 9, 2020

(65) Prior Publication Data

US 2020/0209765 A1 Jul. 2, 2020

Related U.S. Application Data

(63) Continuation of application No. PCT/JP2017/036497, filed on Oct. 6, 2017.

(51) Int. Cl.
*G03F 7/20* (2006.01)
*H05G 2/00* (2006.01)

(52) U.S. Cl.
CPC ...... *G03F 7/70891* (2013.01); *G03F 7/70033* (2013.01); *G03F 7/70491* (2013.01); *H05G 2/006* (2013.01)

(58) Field of Classification Search
CPC .... G03F 7/70891; G03F 7/70033; G03F 7/20; G03F 7/70008; G03F 7/70025;
(Continued)

(56) References Cited

U.S. PATENT DOCUMENTS

2006/0193997 A1 8/2006 Bykanov
2014/0284502 A1* 9/2014 Nakano ............... H01L 22/10
250/504 R
(Continued)

FOREIGN PATENT DOCUMENTS

JP H08126626 A 5/1996
JP 2008094019 A 4/2008
(Continued)

OTHER PUBLICATIONS

International Search Report issued in PCT/JP2017/036497; dated Dec. 26, 2017.
(Continued)

Primary Examiner — Christina A Riddle
(74) Attorney, Agent, or Firm — Studebaker & Brackett PC

(57) ABSTRACT

An extreme ultraviolet light generation device includes: a target supply unit including a nozzle through which a target substance in a liquid form is output into a chamber; a piezoelectric element configured to vibrate the nozzle under a droplet connection condition to regularly generate a droplet of the target substance; and a control unit configured to perform search processing of changing a drive condition of the piezoelectric element to search for a drive condition of the piezoelectric element corresponding to the droplet connection condition and configured to set a drive condition of the piezoelectric element used for generation of extreme ultraviolet light based on a result of the search processing. The control unit preliminarily drives the piezoelectric element before performing the search processing and starts the search processing after performing the preliminary drive.

20 Claims, 19 Drawing Sheets

(58) Field of Classification Search
CPC ............ G03F 7/70041; G03F 7/70141; G03F 7/70483; G03F 7/70491; G03F 7/705; G03F 7/70508; G03F 7/70516; G03F 7/70525; G03F 7/70533; G03F 7/70541; G03F 7/70858; G03F 7/709; G03F 7/7095; H01L 41/04; H01L 41/042; H01L 41/09; H05G 2/00–008
USPC .......... 355/30, 55, 67–77; 250/492.1–504 R, 250/505.1
See application file for complete search history.

(56) References Cited

U.S. PATENT DOCUMENTS

2015/0349236 A1* 12/2015 Furuta .................... H02N 2/145
  348/208.11
2017/0209899 A1* 7/2017 Hirashita ............. B05B 17/0669
2018/0288863 A1 10/2018 Fujimaki et al.

FOREIGN PATENT DOCUMENTS

| | | | |
|---|---|---|---|
| JP | 2014517980 A | 7/2014 | |
| JP | 2015062202 A | 4/2015 | |
| WO | 2012136343 A1 | 10/2012 | |
| WO | WO-2016084167 A1 * | 6/2016 | ......... B05B 17/0676 |
| WO | 2017102931 A1 | 6/2017 | |
| WO | 2017130443 A1 | 8/2017 | |

OTHER PUBLICATIONS

International Preliminary Report on Patentability and Written Opinion issued in PCT/JP2017/036497; dated Apr. 8, 2020.

* cited by examiner

EXTREME ULTRAVIOLET LIGHT GENERATION DEVICE AND TARGET SUPPLY DEVICE

CROSS-REFERENCE TO RELATED APPLICATIONS

The present application is a continuation application of International Application No. PCT/JP2017/036497, filed on Oct. 6, 2017, the entire contents of which are hereby incorporated by reference.

BACKGROUND

1. Technical Field

The present disclosure relates to an extreme ultraviolet light generation device and a target supply device.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2015-62202
Patent Document 2: National Publication of International Patent Application No. 2014-517980

SUMMARY

An extreme ultraviolet light generation device according to an aspect of the present disclosure generates plasma from a target substance by irradiating the target substance with a laser beam to generate extreme ultraviolet light from the plasma. The extreme ultraviolet light generation device includes: a chamber in which the generation of the extreme ultraviolet light is performed; a target supply unit including a nozzle through which the target substance in a liquid form is output into the chamber; a piezoelectric element configured to vibrate the nozzle under a droplet connection condition to regularly generate a droplet of the target substance; and a control unit configured to perform search processing of changing a drive condition of the piezoelectric element to search for a drive condition of the piezoelectric element corresponding to the droplet connection condition and configured to set a drive condition of the piezoelectric element used for generation of extreme ultraviolet light based on a result of the search processing. The control unit preliminarily drives the piezoelectric element before performing the search processing and starts the search processing after performing the preliminary drive.

A target supply device according to another aspect of the present disclosure includes: a tank in which a target substance in a liquid form is housed; a nozzle that is communicated with the tank and through which the target substance is output; a piezoelectric element configured to vibrate the nozzle under a droplet connection condition to regularly generate a droplet of the target substance; and a control unit configured to perform search processing of changing a drive condition of the piezoelectric element to search for a drive condition of the piezoelectric element corresponding to the droplet connection condition and configured to set a drive condition of the piezoelectric element based on a result of the search processing. The control unit preliminarily drives the piezoelectric element before performing the search processing and starts the search processing after performing the preliminary drive.

BRIEF DESCRIPTION OF THE DRAWINGS

Embodiments of the present disclosure will be described below as examples with reference to the accompanying drawings.

DESCRIPTION OF EMBODIMENTS

Figure 1:
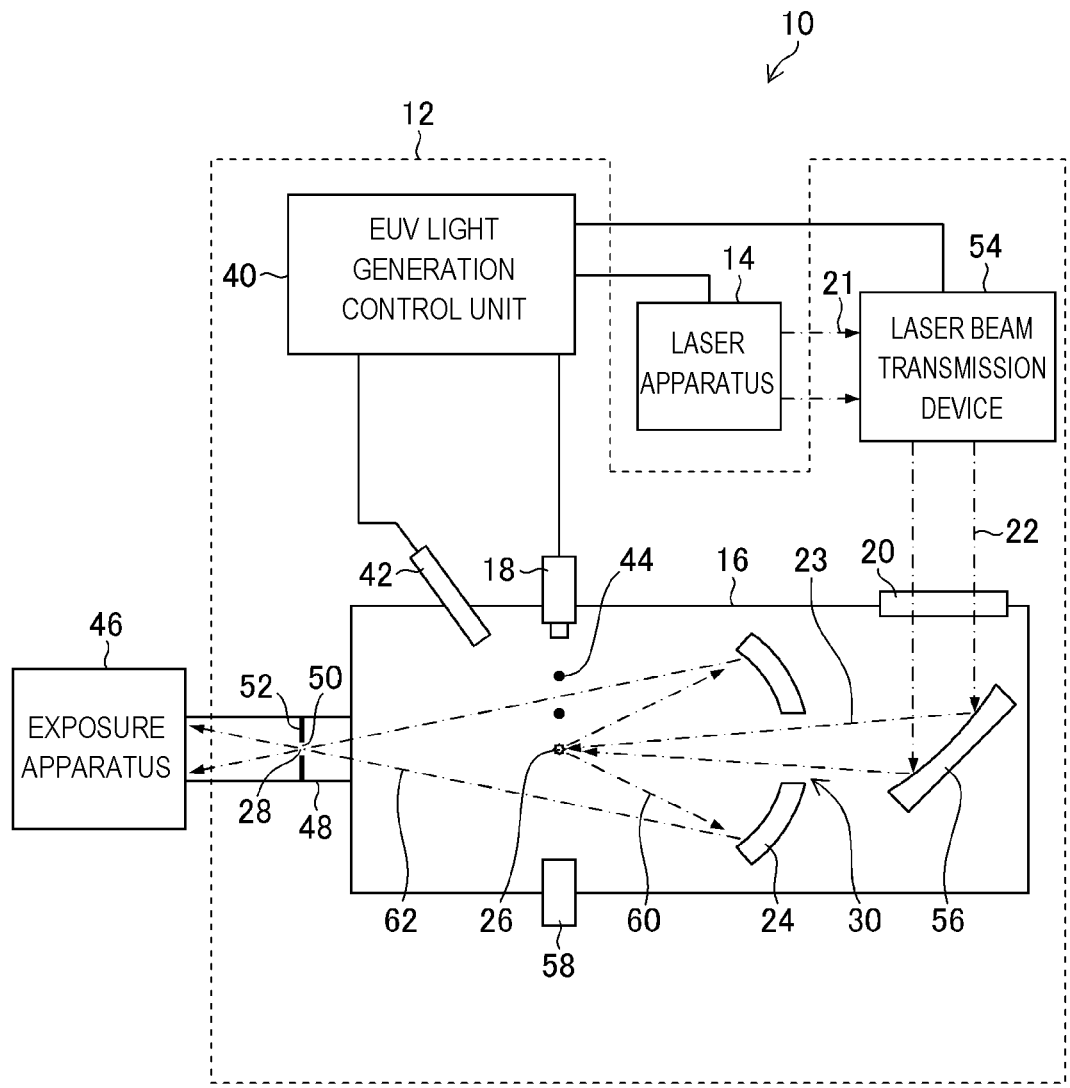
FIG. 1 is a diagram schematically illustrating the configuration of an exemplary LPP EUV light generation system.

<Contents>
1. Overall description of extreme ultraviolet light generation system
1.1 Configuration
1.2 Operation
2. Terms
3. EUV light generation device including target supply device
3.1 Configuration
3.2 Configuration of piezoelectric unit
3.3 Operation
3.4 Piezoelectric adjustment process
4. Problem
5. Embodiment 1
5.1 Preliminary drive of piezoelectric element
5.1.1 Rated preliminary drive
5.1.2 High-load preliminary drive
5.2 Configuration
5.3 Operation
5.4 Exemplary duty adjustment processing
5.5 Effect
6. Embodiment 2
6.1 Configuration
6.2 Operation
6.3 Effect
7. Embodiment 3
7.1 Configuration
7.2 Operation
7.3 Effect
8. Embodiment 4
8.1 Configuration
8.2 Operation
8.3 Effect
9. Exemplary rated operation condition of piezoelectric element
10. Exemplary high-load operation condition of piezoelectric element
10.1 Specific example of high-load operation condition that application voltage is higher than rated operation condition
10.2 Specific example of high-load operation condition that frequency is higher than rated operation condition
10.3 Specific example of high-load operation condition that application voltage and frequency are higher than rated operation condition
11. Laser apparatus Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of Extreme Ultraviolet Light Generation System 1.1 Configuration FIG. 1 schematically illustrates the configuration of an exemplary LPP EUV light generation system 10. An EUV light generation device 12 is used together with at least one laser apparatus 14 in some cases. In the present application, a system including the EUV light generation device 12 and the laser apparatus 14 is referred to as the EUV light generation system 10. As illustrated in FIG. 1 and described below in detail, the EUV light generation device 12 includes a chamber 16 and a target supply unit 18.

The chamber 16 is a sealable container. The target supply unit 18 supplies a target substance into the chamber 16, and is, for example, attached to penetrate through a wall of the chamber 16. The material of the target substance may contain tin, terbium, gadolinium, lithium, xenon, or a combination of two or more thereof, but is not limited thereto.

The wall of the chamber 16 is provided with at least one through-hole. The through-hole is blocked by a window 20 through which a pulse laser beam 22 output from the laser apparatus 14 transmits. For example, an EUV light focusing mirror 24 having a spheroidal surface is disposed inside the chamber 16. The EUV light focusing mirror 24 has first and second focal points. A multi-layer reflective film in which, for example, molybdenum and silicon are alternately stacked is formed on the surface of the EUV light focusing mirror 24. For example, the EUV light focusing mirror 24 is disposed to have the first focal point positioned in a plasma generating region 26 and the second focal point positioned at an intermediate focusing point (IF) 28. The EUV light focusing mirror 24 is provided with, at a central part, a through-hole 30 through which a pulse laser beam 23 passes.

The EUV light generation device 12 includes an EUV light generation control unit 40, a target sensor 42, and the like. The target sensor 42 detects one or a plurality of the existence, locus, position, and speed of a target 44. The target sensor 42 may have an image capturing function.

The EUV light generation device 12 also includes a connection unit 48 that provides communication between the inside of the chamber 16 and the inside of an exposure apparatus 46. The connection unit 48 includes a wall 52 through which an aperture 50 is formed. The wall 52 is disposed so that the aperture 50 is positioned at the second focal point of the EUV light focusing mirror 24.

In addition, the EUV light generation device 12 includes a laser beam transmission device 54, a laser beam focusing mirror 56, a target collection unit 58 for collecting the target 44, and the like. The laser beam transmission device 54 includes an optical element for defining the transmission state of a laser beam, and an actuator for adjusting the position, posture, and the like of the optical element. The target collection unit 58 is disposed on the extended line of a direction in which the target 44 output into the chamber 16 travels.

The laser apparatus 14 may be a master oscillator power amplifier (MOPA) system. The laser apparatus 14 includes a master oscillator (not illustrated), an optical isolator (not illustrated), and a plurality of $CO_2$ laser amplifiers (not illustrated). The master oscillator may be a solid-state laser. The wavelength of a laser beam output from the master oscillator is, for example, 10.59 μm, and the repetition frequency of pulse oscillation is, for example, 100 kHz.

1.2 Operation

The following describes operation of the exemplary LPP EUV light generation system 10 with reference to FIG. 1. The inside of the chamber 16 is held at a pressure lower than atmospheric pressure, and may be preferably vacuum. Alternatively, gas having a high EUV light transmissivity exists inside the chamber 16.

A pulse laser beam 21 output from the laser apparatus 14 passes through the laser beam transmission device 54 and is incident in the chamber 16 through the window 20 as the pulse laser beam 22. The pulse laser beam 22 travels along at least one laser beam path in the chamber 16 and is reflected by the laser beam focusing mirror 56 and incident on at least one target 44 as the pulse laser beam 23.

The target supply unit 18 outputs the target 44 made of the target substance toward the plasma generating region 26 in the chamber 16. The target supply unit 18 forms droplets by, for example, a continuous jet scheme. In the continuous jet scheme, a nozzle is vibrated to provide standing wave to flow of the target substance ejected in a jet form from a nozzle hole, thereby periodically separating the target substance. The separated target substance forms a free interface by the own surface tension, thereby forming a droplet.

The target 44 is irradiated with at least one pulse included in the pulse laser beam 23. Plasma is generated from the target 44 irradiated with the pulse laser beam, and radiates radiation light 60. EUV light 62 contained in the radiation light 60 is selectively reflected by the EUV light focusing mirror 24. Having been reflected by the EUV light focusing mirror 24, the EUV light 62 is condensed at the intermediate focusing point 28 and output to the exposure apparatus 46. The single target 44 is irradiated with a plurality of pulses included in the pulse laser beam 23.

The EUV light generation control unit 40 collectively controls the entire EUV light generation system 10. The EUV light generation control unit 40 processes a result of detection by the target sensor 42. The EUV light generation control unit 40 controls, based on the result of detection by the target sensor 42, the timing at which the target 44 is output, the direction in which the target 44 is output, and the like. In addition, the EUV light generation control unit 40 controls the oscillation timing of the laser apparatus 14, the traveling direction of the pulse laser beam 22, the focusing position of the pulse laser beam 23, and the like. These various kinds of control are merely exemplary, and may include other control as necessary.

2. Terms

"Target" is an object irradiated with a laser beam introduced into the chamber. Plasma is generated from the target irradiated with the laser beam and radiates EUV light. The target is the plasma generation source.

"Droplet" is a form of a target supplied into the chamber. The droplet may be the target having a substantially spherical shape by the surface tension of the target substance being melted.

"Pulse laser beam" may be a laser beam including a plurality of pulses.

"Laser beam" is not limited to a pulse laser beam but may be a general laser beam.

"Laser beam path" is the optical path of a laser beam.

"$CO_2$" is carbon dioxide.

"Plasma light" is radiation light radiated from plasma of a target. This radiation light includes EUV light.

"EUV light" stands for "extreme ultraviolet light".

"Piezoelectric element" is synonymous with dielectric element. The piezoelectric element is simply referred to as "piezoelectric" in some cases.

"Duty" is the ratio of a high-voltage level side voltage time (Th) relative to one pulse period (T) in a voltage waveform of square wave applied to the piezoelectric element. The duty is expressed in percentage (%). The numerical value of the duty is referred to as a duty value.

Figure 2:
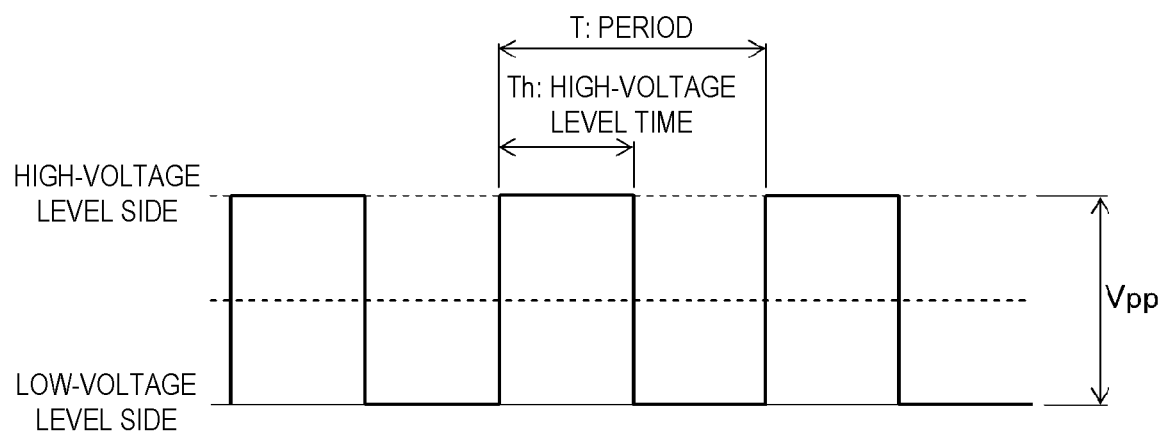
FIG. 2 is a waveform diagram illustrating an exemplary voltage waveform of square wave.

FIG. 2 illustrates an exemplary voltage waveform of square wave. The horizontal axis represents time, and the vertical axis represents voltage. The duty (%) is (Th/T)*100.

In FIG. 2, "Vpp" is the voltage difference between a high-voltage level side voltage and a low-voltage level side voltage. Vpp is referred to as an application voltage.

The frequency (Hz) is 1/T.

3. EUV Light Generation Device Including Target Supply Device 3.1 Configuration

Figure 3:
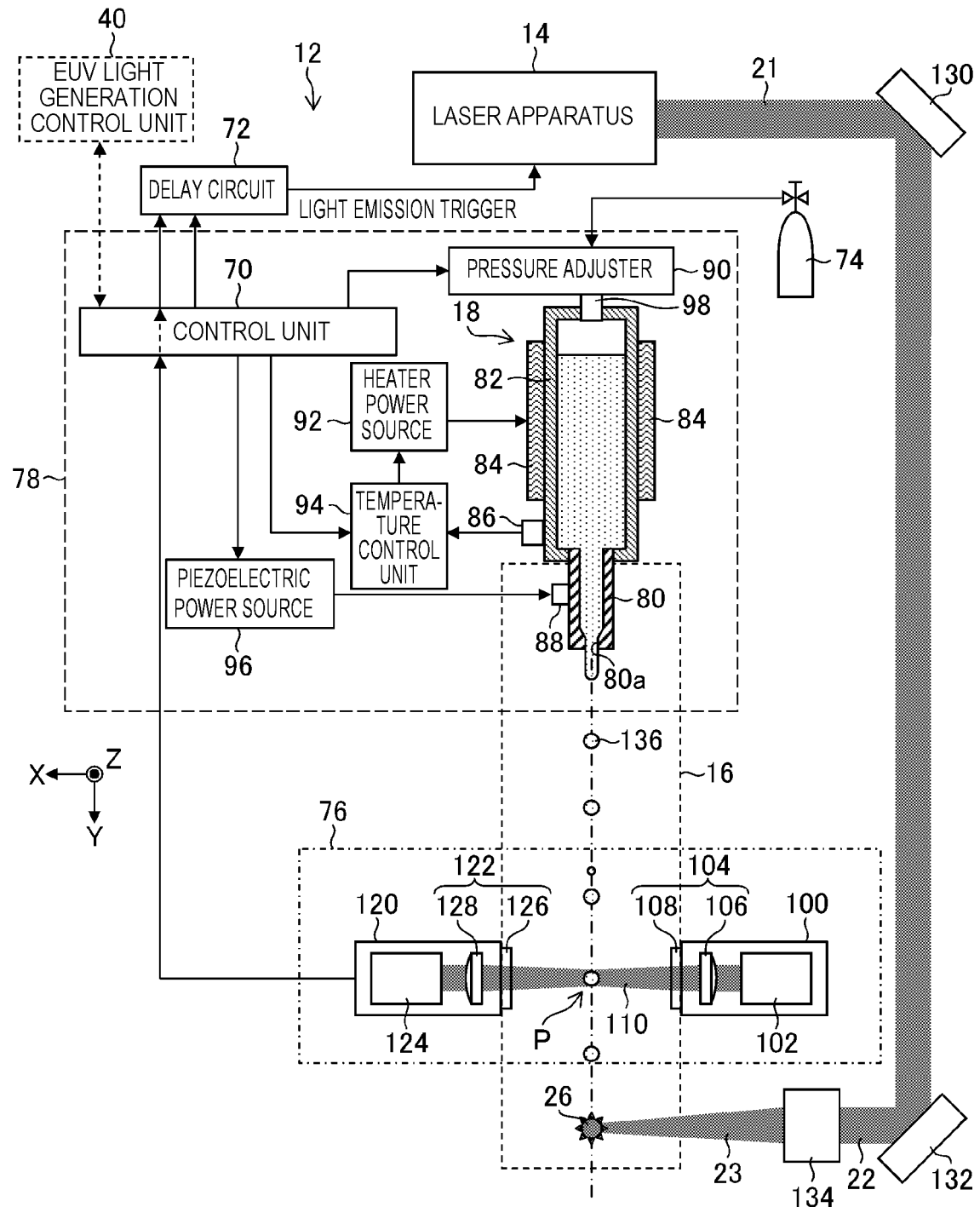
FIG. 3 is a diagram schematically illustrating the configuration of an EUV light generation device including a target supply device.

FIG. 3 schematically illustrates the configuration of an EUV light generation device including a target supply device. This EUV light generation device 12 includes a control unit 70, a delay circuit 72, the target supply unit 18, an inert gas supply unit 74, and a droplet detection device 76.

The target supply unit 18 includes a nozzle 80 from which the target substance is output, a tank 82 in which the target substance is stored, a heater 84, a temperature sensor 86, a piezoelectric unit 88, and a pressure adjuster 90.

A target supply device 78 includes the control unit 70, the target supply unit 18, a heater power source 92, a temperature control unit 94, and a piezoelectric power source 96. In addition, the target supply device 78 may include the droplet detection device 76.

The tank 82 is formed in a hollow tubular shape. The target substance is housed inside the hollow tank 82. At least the inside of the tank 82 is formed of a material unlikely to react with the target substance. Examples of materials unlikely to react with tin as an exemplary target substance include SiC, $SiO_2$, $Al_2O_3$, molybdenum, tungsten, and tantalum.

The heater 84 and the temperature sensor 86 are fixed to the tank 82. The heater 84 is fixed to an outer side surface part of the tubular tank 82. The heater 84 fixed to the tank 82 heats the tank 82. The heater 84 is connected with the heater power source 92.

The heater power source 92 supplies electrical power to the heater 84. The heater power source 92 is connected with the temperature control unit 94. The temperature control unit 94 may be connected with the control unit 70 or included in the control unit 70. The electrical power supply from the heater power source 92 to the heater 84 is controlled by the temperature control unit 94.

The temperature sensor 86 is fixed to the outer side surface part of the tank 82. The temperature sensor 86 is connected with the temperature control unit 94. The temperature sensor 86 detects the temperature of the tank 82 and outputs a detection signal to the temperature control unit 94. The temperature control unit 94 can adjust the electrical power supplied to the heater 84 based on the detection signal output from the temperature sensor 86.

A temperature adjustment mechanism including the heater 84 and the heater power source 92 can adjust the temperature of the tank 82 based on a control signal from the temperature control unit 94.

The pressure adjuster 90 is disposed on a pipe 98 between the inert gas supply unit 74 and the tank 82. The pipe 98 can provide communication between the target supply unit 18 including the tank 82 and the pressure adjuster 90. The pipe 98 may be covered by a heat insulation material (not illustrated) or the like. A heater (not illustrated) is disposed on the pipe 98. The temperature in the pipe 98 may be maintained equal to the temperature in the tank 82 of the target supply unit 18.

The inert gas supply unit 74 includes a gas tank filled with inert gas such as helium or argon. The inert gas supply unit 74 supplies the inert gas into the tank 82 through the pressure adjuster 90. In the present example, the inert gas is argon.

The pressure adjuster 90 may include an electromagnetic valve, a pressure sensor, and the like (not illustrated) for gas supply and discharge. The pressure adjuster 90 detects the pressure in the tank 82 by using the pressure sensor (not illustrated). The pressure adjuster 90 is coupled with a discharge pump (not illustrated). The pressure adjuster 90 operates the discharge pump (not illustrated) to discharge gas from the tank 82.

The pressure adjuster 90 increases or decreases the pressure in the tank 82 by supplying gas into the tank 82 or discharging gas from the tank 82. The pressure adjuster 90 is connected with the control unit 70. The pressure adjuster 90 outputs a detection signal of a detected pressure to the control unit 70. The pressure adjuster 90 receives a control signal output from the control unit 70.

The control unit 70 supplies, based on the detection signal output from the pressure adjuster 90, the pressure adjuster 90 with a control signal for controlling operation of the pressure adjuster 90 so that the pressure in the tank 82 becomes equal to a target pressure. The pressure adjuster 90 supplies gas into the tank 82 or discharges gas from the tank 82 based on the control signal from the control unit 70. The pressure in the tank 82 can be adjusted to the target pressure through the gas supply or discharge by the pressure adjuster 90.

The nozzle 80 includes a nozzle hole 80a through which the target substance is output. The target substance output through the nozzle hole 80a may be, for example, liquid tin.

The nozzle 80 is provided at a bottom surface part of the tubular tank 82. The nozzle 80 is disposed inside the chamber 16 through a target supply hole (not illustrated) of the chamber 16. The target supply hole of the chamber 16 is blocked when the target supply unit 18 is disposed. When the target supply unit 18 is disposed to block the target supply hole of the chamber 16, the inside of the chamber 16 is isolated from atmosphere. At least the inner surface of the nozzle 80 is formed of a material unlikely to react with the target material.

One end of the nozzle 80 in a pipe shape is fixed to the hollow tank 82. The other end of the nozzle 80 in a pipe shape is provided with the nozzle hole 80a. The tank 82 on the one end side of the nozzle 80 is positioned outside the chamber 16, and the nozzle hole 80a on the other end side of the nozzle 80 is positioned inside the chamber 16. The plasma generating region 26 inside the chamber 16 is positioned on the extended line of the center axis of the nozzle 80. The direction of the center axis of the nozzle 80 may be in a Y-axis direction. The insides of the tank 82, the nozzle 80, and the chamber 16 are communicated with each other.

The nozzle hole 80a is formed in such a shape that the target substance being melted is ejected in a jet form into the chamber 16.

The piezoelectric unit 88 is fixed to the nozzle 80. The piezoelectric unit 88 includes a piezoelectric element. The piezoelectric element is not illustrated in FIG. 3 but is denoted by reference sign 202 in FIG. 4. The configuration of the piezoelectric unit 88 will be described later with reference to FIGS. 4 and 5.

This piezoelectric element 202 of the piezoelectric unit 88 is connected with the piezoelectric power source 96. The piezoelectric unit 88 provides vibration to the nozzle 80.

The target supply unit 18 forms a droplet 136 by, for example, the continuous jet scheme. In the continuous jet scheme, the nozzle 80 is vibrated to provide periodic vibration (typically, sine wave) to flow of the target substance ejected in a jet form, thereby periodically separating the target substance. The separated target substance forms a free interface by the own surface tension, thereby forming the droplet 136.

The piezoelectric unit 88 and the piezoelectric power source 96 may be elements of a droplet formation mechanism that provides vibration necessary for forming the droplet 136 to the nozzle 80.

The piezoelectric power source 96 supplies electrical power to the piezoelectric element 202. The piezoelectric power source 96 is connected with the control unit 70. The electrical power supply by the piezoelectric power source 96 to the piezoelectric element 202 is controlled by the control unit 70.

The droplet detection device 76 may be part or the entire of the target sensor 42 described with reference to FIG. 1. The droplet detection device 76 detects the droplet 136 output into the chamber 16.

The droplet detection device 76 includes a light source unit 100 and a light receiving unit 120. The light source unit 100 includes a light source 102 and an illumination optical system 104. The light source unit 100 is disposed to illuminate a droplet at a predetermined position P on the trajectory between the nozzle 80 of the target supply unit 18 and the plasma generating region 26. The light source 102 may be a continuous-wave (CW) laser beam source. The illumination optical system 104 includes a condenser lens 106 and a window 108.

The beam diameter of a continuous laser beam with which the droplet 136 is irradiated may be sufficiently larger than the diameter of the droplet 136. The diameter of the droplet 136 is, for example, 20 µm.

The light source unit 100 and the light receiving unit 120 are disposed opposite to each other with interposed therebetween a target travel path that is the travel path of the droplet 136 as a target output into the chamber 16. The direction in which the light source unit 100 and the light receiving unit 120 are opposite to each other is orthogonal to the target travel path.

When the droplet 136 traveling on the target travel path reaches the predetermined position P, the droplet 136 can be irradiated with illumination light 110 emitted from the light source unit 100.

The light receiving unit 120 includes a light receiving optical system 122 and an optical sensor 124. The light receiving unit 120 is disposed to receive the illumination light 110 output from the light source unit 100. The light receiving optical system 122 includes a window 126 and a condenser lens 128. The light receiving optical system 122 may be an optical system such as a collimator, and includes an optical element such as a lens. The light receiving optical system 122 guides, to the optical sensor 124, a continuous laser beam emitted from the light source unit 100.

The optical sensor 124 is a light receiving element including one or a plurality of light-receiving surfaces. The optical sensor 124 may be any of a photodiode, a photodiode array, an avalanche photodiode, a photomultiplier, a multi pixel photon counter, and an image intensifier. The optical sensor 124 detects the light intensity of the continuous laser beam guided by the light receiving optical system 122. The optical sensor 124 is connected with the control unit 70. The optical sensor 124 supplies a detection signal of the detected light intensity to the control unit 70.

When the droplet 136 passes through the predetermined position P on the target travel path, part of the continuous laser beam is shielded by the droplet 136, and the light intensity received by the light receiving unit 120 decreases. The light receiving unit 120 can output, to the control unit 70, a detection signal in accordance with the light intensity decrease due to the passing of the droplet 136. The detection signal in accordance with the light intensity decrease due to the droplet 136 is referred to as a "passing timing signal".

The control unit 70 can detect the timing at which the droplet 136 is detected at the predetermined position P based on the passing timing signal from the droplet detection device 76. In particular, the control unit 70 can detect the timing at which the droplet 136 passes through the predetermined position P on the target travel path.

The timing at which the droplet detection device 76 detects the droplet 136 is referred to as a "passing timing". The passing timing is the timing at which the droplet 136 passes through the predetermined position P on the target travel path.

The delay circuit 72 may be configured as part of the control unit 70. The passing timing signal as an output signal from the droplet detection device 76 is input to the delay circuit 72 through the control unit 70. The delay circuit 72 is connected with a signal line through which the control unit 70 sets the delay time of the delay circuit 72. An output from the delay circuit 72 is input to the laser apparatus 14 as a light emission trigger.

The EUV light generation device 12 includes a first high reflectance mirror 130, a second high reflectance mirror 132, and a laser beam focusing optical system 134. The laser beam transmission device 54 described with reference to FIG. 1 includes the first high reflectance mirror 130 and the second high reflectance mirror 132. The laser beam focusing optical system 134 includes the laser beam focusing mirror 56 described with reference to FIG. 1.

Figure 4:
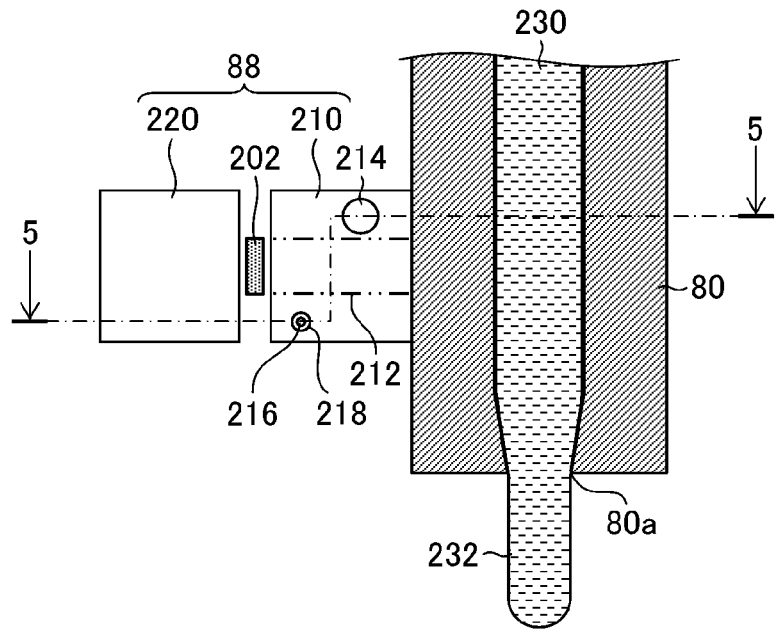
FIG. 4 is a cross-sectional view illustrating the configuration of a piezoelectric unit.
Figure 4:
Figure 4:

For the purpose of description related to directions, an XYZ orthogonal coordinate system is introduced in FIG. 3. The direction of a Z axis is defined to be the direction in which EUV light is guided from the chamber 16 toward the exposure apparatus 46. An X axis and a Y axis are orthogonal to the Z axis and orthogonal to each other. The direction of the Y axis is defined to be the direction of the center axis of the nozzle 80 from which the target substance is output. The direction of the Y axis is the trajectory direction of the droplet 136. The direction of the Z axis is defined to be a direction orthogonal to the sheet of FIG. 3. FIG. 4 and the following drawings also use the coordinate system introduced in FIG. 3.

The chamber 16 of the EUV light generation device 12 is formed in, for example, a hollow spherical shape or tubular shape. The direction of the center axis of the chamber 16 in a tubular shape may be the direction in which the EUV light 62 is guided to the exposure apparatus 46, in other words, the Z-axis direction. The chamber 16 includes an exhaust device (not illustrated) and a pressure sensor.

The EUV light generation control unit 40 communicates signals with an exposure apparatus control unit (not illustrated) as a control unit of the exposure apparatus 46. The EUV light generation control unit 40 collectively controls operation of the entire EUV light generation system 10 based on a command from the exposure apparatus 46. The EUV light generation control unit 40 communicates control signals with the laser apparatus 14. Accordingly, the EUV light generation control unit 40 controls operation of the laser apparatus 14.

The EUV light generation control unit 40 communicates control signals with an actuator (not illustrated) of each of the laser beam transmission device 54 and the laser beam focusing optical system 134. Accordingly, the EUV light generation control unit 40 adjusts the traveling direction and focusing position of each of the pulse laser beams 21, 22, and 23.

The EUV light generation control unit 40 communicates control signals with the control unit 70 of the target supply device 78. Accordingly, the EUV light generation control unit 40 controls operation of the target supply device 78, the droplet detection device 76, and the laser apparatus 14.

In the present disclosure, the EUV light generation control unit 40, the control unit 70, and any other control device can be achieved by hardware and software combination of one or a plurality of computers. The software is synonymous with a computer program. The computers conceptually include a programmable controller. Some or all of processing functions of the EUV light generation control unit 40, the control unit 70, and any other control device may be achieved by using an integrated circuit such as a field programmable gate array (FPGA) or an application specific integrated circuit (ASIC).

Functions of a plurality of control devices can be achieved by a single control device. In the present disclosure, the EUV light generation control unit 40, the control unit 70, and the other control device may be connected with each other through a communication network such as a local area network or the Internet. In a distributed computing environment, a computer program unit may be stored in both of local and remote memory storage devices.

3.2 Configuration of Piezoelectric Unit

Figure 5:
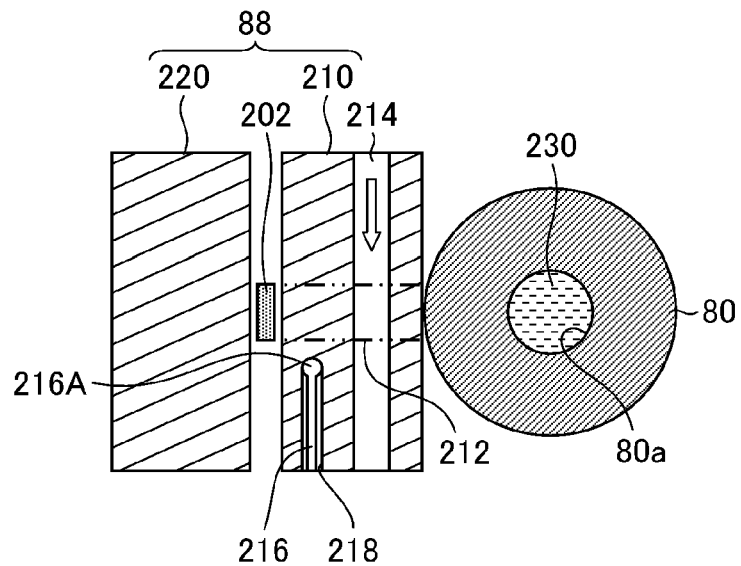
FIG. 5 is a cross-sectional view of the piezoelectric unit in FIG. 4 taken along line 5-5.

FIG. 4 is a longitudinal sectional view of the nozzle 80 and the piezoelectric unit 88 taken along a plane including the central axis of the nozzle 80. FIG. 5 is a cross-sectional view taken along line 5-5 in FIG. 4. FIG. 5 is equivalent to a transverse sectional view of the nozzle 80 and the piezoelectric unit 88 taken along a plane orthogonal to the central axis of the nozzle 80.

The piezoelectric unit 88 includes the piezoelectric element 202, a first component 210, and a second component 220. In the piezoelectric unit 88, the piezoelectric element 202 is sandwiched between the first component 210 and the second component 220. The first component 210 is fixed to an outer side surface part of the nozzle 80. The first component 210 transfers vibration of the piezoelectric element 202 to the nozzle 80. The second component 220 is fastened to the first component 210 by using a bolt (not illustrated). The second component 220 presses the piezoelectric element 202 against the first component 210 to facilitate transfer of vibration of the piezoelectric element 202 to the first component 210.

The range illustrated with dashed and double-dotted lines in the first component 210 in FIG. 4 is a vibration transfer path 212 of the piezoelectric element 202. The vibration transfer path 212 is a region overlapping the region of the piezoelectric element 202 when the region of the piezoelectric element 202 is viewed in the direction from the piezoelectric element 202 toward the nozzle 80, and is a region directly underneath the piezoelectric element 202.

The first component 210 is provided with a cooling water path 214. Cooling water flows through the cooling water path 214 of the first component 210 to reduce heating of the piezoelectric element 202 due to heat transfer from the nozzle 80. The white arrow in FIG. 5 indicates flow of the cooling water.

A temperature sensor 216 is disposed at the first component 210. The temperature sensor 216 measures the temperature inside the first component 210, not at the surface of the first component 210. The first component 210 is provided with a hole 218 into which the temperature sensor 216 is inserted. The hole 218 reaches near the vibration transfer path 212 inside the first component 210. The temperature sensor 216 is inserted into the hole 218 provided to the first component 210. The temperature sensor 216 and the cooling water path 214 are desirably not disposed in the vibration transfer path 212. This is to avoid encumbrance of the vibration transfer. As illustrated in FIG. 4, the temperature sensor 216 and the cooling water path 214 are disposed not in the vibration transfer path 212 but outside the vibration transfer path 212.

A temperature sensing unit 216A of the temperature sensor 216 is preferably disposed as close to the vibration transfer path 212 as possible. This is to measure the temperature of the vibration transfer path 212 close to the piezoelectric element 202. The temperature of the piezoelectric unit 88 measured by the temperature sensor 216 is referred to as a piezoelectric-unit temperature. The piezoelectric-unit temperature can be substantially regarded as the temperature of the piezoelectric element 202. Thus, temperature information obtained from the temperature sensor 216 can be used as information indicating the temperature of the piezoelectric element 202. In the present example, the piezoelectric-unit temperature is treated as the temperature of the piezoelectric element 202. The temperature sensor 216 corresponds to an exemplary temperature sensor configured to measure the temperature of a piezoelectric element.

As for the positional relation between the cooling water path 214 and the temperature sensor 216 in the piezoelectric unit 88, the cooling water path 214 and the temperature sensor 216 are preferably disposed at positions separated from each other as far as possible. As illustrated in FIG. 4, the cooling water path 214 may be provided at a position closer to the nozzle 80 in the first component 210, and the temperature sensor 216 may be provided at a position closer to the piezoelectric element 202 in the first component 210.

3.3 Operation

The following describes operation of the EUV light generation device 12 with reference to FIGS. 3 to 5. The EUV light generation control unit 40 controls the exhaust device (not illustrated) so that the chamber 16 is vacuum. The EUV light generation control unit 40 controls, based on a value detected by the pressure sensor (not illustrated), discharge by the exhaust device and gas supply from a gas supply device (not illustrated) so that the pressure inside the chamber 16 is in a predetermined range.

When having received a target generation signal from the EUV light generation control unit 40, the control unit 70 controls the heater 84 through the temperature control unit 94 so that the target substance in the target supply unit 18 has a predetermined temperature equal to or higher than the melting point. The temperature control unit 94 controls the heater power source 92 based on a detected value of the temperature sensor 86 under control of the control unit 70. For example, tin (Sn), which has a melting point of 232° C., is used as the target substance. The control unit 70 controls the heater 84 so that tin in the target supply unit 18 has, for example, a predetermined temperature in the range of 232° C. to 300° C. As a result, the tin stored in the target supply unit 18 melts into liquid. The melted tin is an exemplary "target substance in a liquid form".

To discharge the liquid target substance through the nozzle hole 80*a*, the control unit 70 controls the pressure adjuster 90 so that the pressure in the tank 82 becomes a predetermined pressure. The pressure adjuster 90 can increase or decrease the pressure in the tank 82 by supplying gas into the tank 82 or discharging gas from the tank 82 based on a control signal from the control unit 70. Specifically, the pressure adjuster 90 adjusts, in accordance with an instruction from the control unit 70, the pressure in the tank 82 to a predetermined value so that the droplet 136 reaches the plasma generating region 26 through a predetermined target trajectory at a predetermined target speed.

The predetermined target speed of the droplet 136 may be in, for example, the range of 60 m/s to 120 m/s. The predetermined value of the pressure of the tank 82 may be in, for example, the range of several MPa to 40 MPa. As a result, as illustrated in FIG. 4, liquid tin 230 is supplied into the nozzle 80, and a jet 232 of the liquid tin 230 is ejected at the predetermined speed through the nozzle hole 80*a*.

Figure 6:
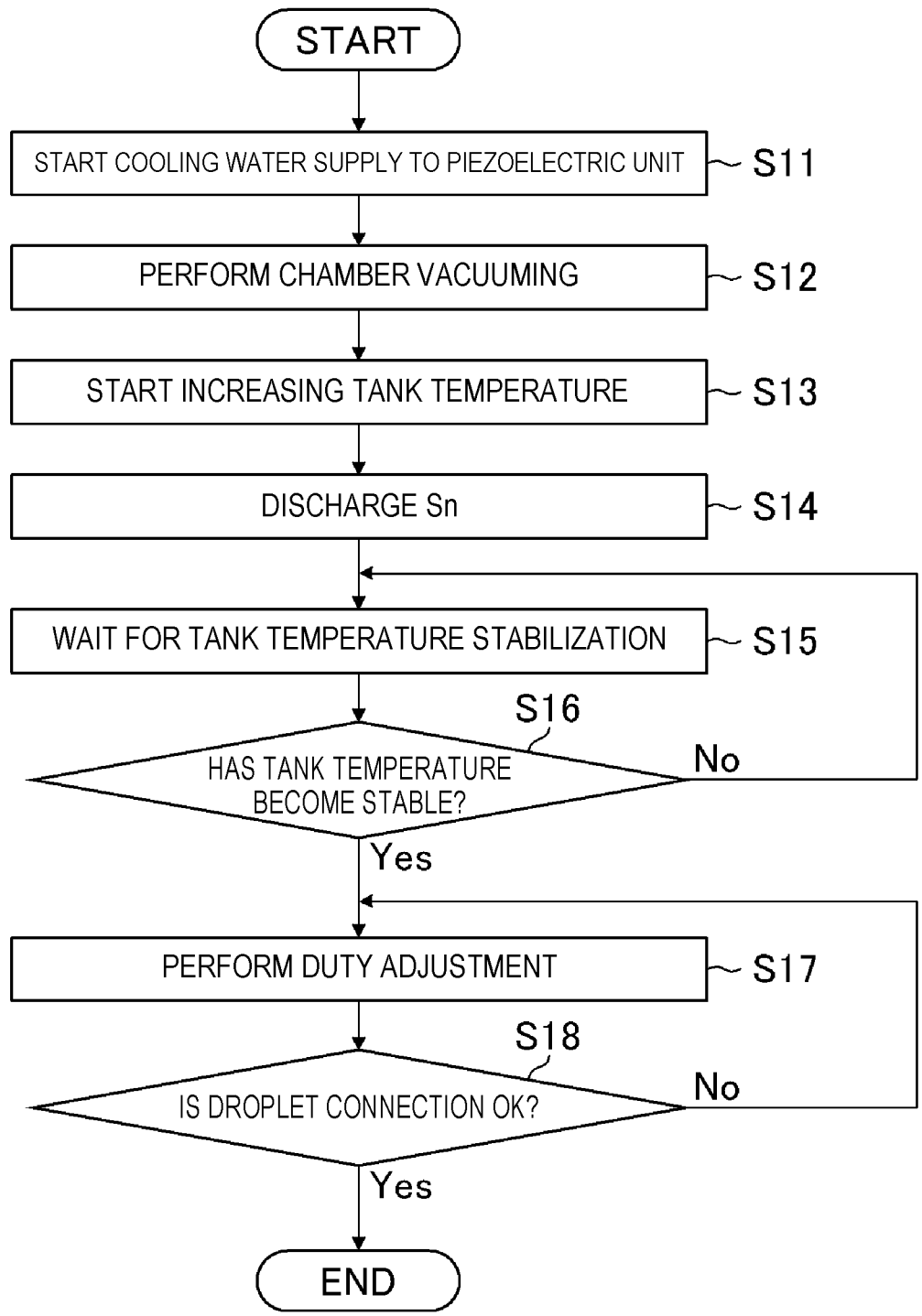
FIG. 6 is a flowchart illustrating the process of piezoelectric adjustment including duty adjustment.

The control unit 70 transmits, to the piezoelectric element 202, an electric signal from the piezoelectric power source 96 and performs duty adjustment to regularly generate the droplet 136 at a predetermined piezoelectric drive frequency from the liquid tin 230 output through the nozzle 80. The content of the duty adjustment will be described in detail later (FIG. 6). The nozzle 80 is vibrated by the piezoelectric element 202 when an electric signal of square wave with an appropriate duty value set by performing the duty adjustment is transmitted to the piezoelectric element 202.

The control unit 70 transmits an electric signal having a predetermined piezoelectric drive frequency and a predetermined duty to the piezoelectric element 202 through the piezoelectric power source 96 so that the liquid tin output from the nozzle 80 generates the droplet 136.

The piezoelectric power source 96 supplies drive electrical power to the piezoelectric element 202 in accordance with an instruction from the control unit 70. As a result, the nozzle 80 is vibrated by the piezoelectric element 202. The droplets 136 having volumes substantially equal to each other are periodically generated when the jet 232 of the liquid tin 230 output from the nozzle hole 80a is provided with regular vibration that promotes droplet connection. Then, the droplet 136 can be supplied to the plasma generating region 26.

As the droplet 136 passes through the predetermined position P on the trajectory between the nozzle hole 80a and the plasma generating region 26, the amount of illumination light incident on the optical sensor 124 of the light receiving unit 120 decreases. The light receiving unit 120 generates a detection signal in accordance with the amount of light received by the optical sensor 124.

The detection signal output from the light receiving unit 120 is transmitted to the control unit 70. The control unit 70 generates a droplet detection signal that becomes a "High" level in a duration in which the amount of light received by the optical sensor 124 is equal to or smaller than a predetermined threshold. The droplet detection signal is input from the control unit 70 to the delay circuit 72.

The delay circuit 72 generates a light emission trigger behind the droplet detection signal by a delay time, and inputs the light emission trigger to the laser apparatus 14. The delay time of the delay circuit 72 is set so that the light emission trigger is input to the laser apparatus 14 before the droplet 136 reaches the plasma generating region 26 after passing through the predetermined position P. In other words, the delay time is set so that the droplet 136 is irradiated with a pulse laser beam output from the laser apparatus 14 when the droplet 136 reaches the plasma generating region 26.

The pulse laser beam output from the laser apparatus 14 is guided to the plasma generating region 26 through the first high reflectance mirror 130, the second high reflectance mirror 132, and the laser beam focusing optical system 134, and incident on the droplet 136. The plasma generating region 26 may correspond to the focusing position of the pulse laser beam.

3.4 Piezoelectric Adjustment Process

FIG. 6 is a flowchart illustrating the process of piezoelectric adjustment performed to adjust a drive condition of the piezoelectric element.

At step S11, the control unit 70 starts supply of the cooling water to the piezoelectric unit 88.

At step S12, the control unit 70 vacuums the chamber 16. The "vacuuming" means discharge of gas in the chamber 16 so that the chamber 16 becomes vacuum.

When having received a target generation signal from the EUV light generation control unit 40, the control unit 70 starts increasing the temperature of the tank 82 of the target supply unit 18 at step S13. The control unit 70 heats the tank 82 to a predetermined temperature equal to higher than the melting point of tin. The temperature of the tank 82 is sensed by the temperature sensor 86 and controlled by the temperature control unit 94. In other words, the temperature of the tank 82 is the temperature of the target supply unit 18.

Thereafter, at step S14, the control unit 70 controls the pressure adjuster 90 to apply predetermined argon pressure to the tank 82 so that tin (Sn) as the target substance is discharged through the nozzle 80.

At step S15, the control unit 70 waits until the temperature of the tank 82 becomes stable.

At step S16, the control unit 70 determines whether the tank temperature has become stable. When negative determination is obtained at step S16, in other words, when it is determined that the tank temperature has not become stable, the control unit 70 returns to step S15.

When positive determination is obtained at step S16, in other words, when it is determined that the tank temperature has become stable, the control unit 70 proceeds to step S17.

At step S17, the control unit 70 performs duty adjustment of a voltage waveform applied to drive the piezoelectric element 202. The duty adjustment includes the process of applying square wave having a rated frequency and a rated voltage to the piezoelectric element 202 and sequentially changing the duty value of the square wave at a predetermined step in a predetermined range to search for a duty value at which droplets are connected with each other. The duty adjustment is processing of searching for the duty value as a drive condition corresponding to a droplet connection condition and is exemplary "search processing".

At step S18, the control unit 70 determines whether a duty value that promotes droplet connection is obtained. When negative determination is obtained at step S18, the control unit 70 returns to step S17 to continue the duty value search. When a duty value that promotes droplet connection is obtained through the duty adjustment at step S17, positive determination is obtained at step S18, which ends the flowchart in FIG. 6. Specifically, the control unit 70 performs the duty adjustment to obtain a duty value at which droplets are most reliably connected with each other and sets this optimum duty value as a drive condition of the piezoelectric element in an EUV light generation process. In the EUV light generation process thereafter, the piezoelectric element is continuously driven by using square wave with the optimum duty value determined by the duty adjustment.

4. Problem

When voltage is repeatedly applied to the piezoelectric element, the temperature of the piezoelectric element increases due to self-heat generation. Characteristics of vibration propagating from the piezoelectric element to the nozzle are affected by the temperature of the piezoelectric element and the temperature of a path extending from the piezoelectric element to the nozzle. The "characteristics of vibration" include at least one of frequency, strength, and phase.

In the EUV light generation device 12, before the EUV light generation process, an appropriate duty value needs to be selected by searching for a duty value at which droplet connection is promoted through a duty adjustment process to determine the drive condition of the piezoelectric element 202 of the target supply unit 18. The duty value at which droplet connection is promoted is a duty value corresponding to the droplet connection condition that the droplet 136 is regularly generated.

Figure 7:
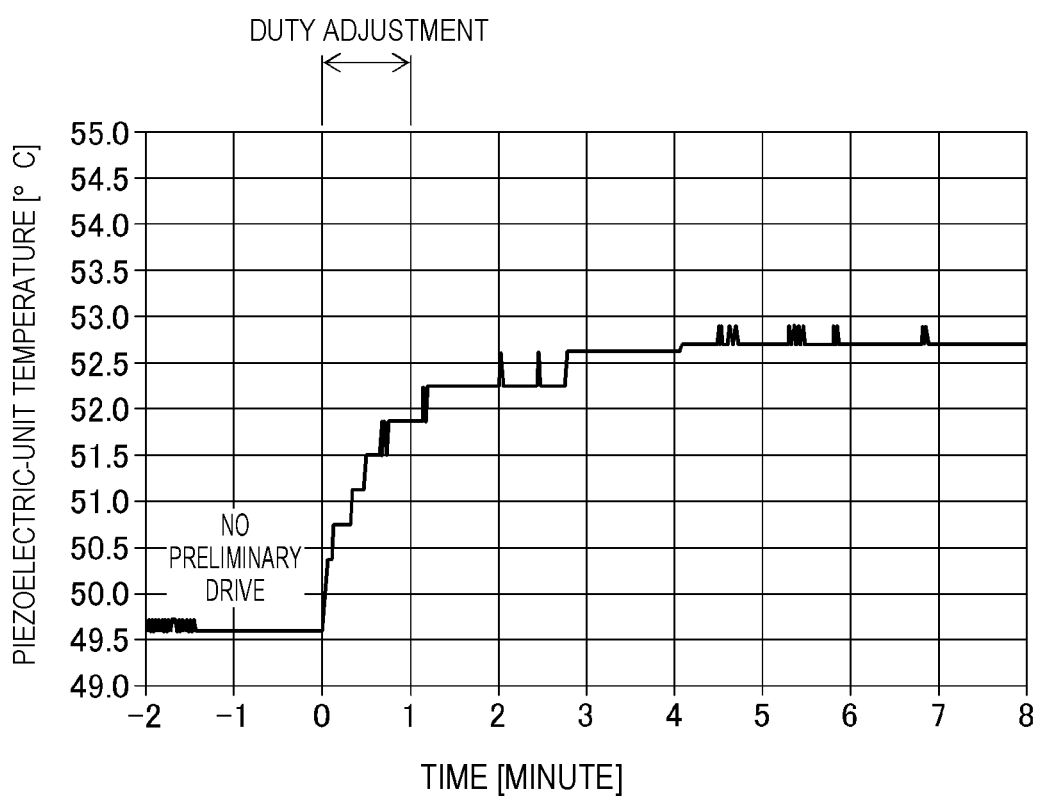
FIG. 7 is a graph illustrating change of the temperature of the piezoelectric unit.

However, in a conventional duty adjustment process, the temperature of the piezoelectric unit 88 increases by 3° C. through the process (refer to FIG. 7). Thus, the piezoelectric-unit temperature when droplet connection is promoted in the duty adjustment process and a duty value is selected deviates from the piezoelectric-unit temperature in the EUV light generation process performed by actually using a waveform with the duty value. Due to this temperature condition deviation, it has been difficult to promote droplet connection in the EUV light generation process with the duty value selected through the duty adjustment process.

FIG. 7 is a graph illustrating change of the piezoelectric-unit temperature. When the piezoelectric element 202 is driven to perform the duty adjustment, the temperature of the piezoelectric element 202 increases due to self-heat generation. Thus, the piezoelectric-unit temperature during the EUV light generation process deviates from the piezoelectric-unit temperature during the duty adjustment or at the end of the duty adjustment, and vibration characteristics of the piezoelectric element change so that droplet connection is difficult to be maintained. The end of the duty adjustment is, in other words, the timing of duty value setting in which the duty value selected through the duty adjustment is set.

To maintain stable droplet connection in the EUV light generation process, the piezoelectric-unit temperature during the duty adjustment and the piezoelectric-unit temperature during the EUV light generation process are desired to be equal or substantially equal to each other.

5. Embodiment 1

5.1 Preliminary Drive of Piezoelectric Element

In the EUV light generation device of the present disclosure, before the duty adjustment process, the piezoelectric element is preliminarily driven to increase in advance the piezoelectric-unit temperature to a temperature equivalent to the piezoelectric-unit temperature during the EUV light generation process or to a temperature higher than the piezoelectric-unit temperature during the EUV light generation process. The EUV light generation process is an operation duration during which EUV light is generated. The piezoelectric-unit temperature during the EUV light generation process is the piezoelectric-unit temperature while temperature increase of the piezoelectric unit in the EUV light generation process is saturated. The piezoelectric element may be preliminarily driven by rated preliminary drive or high-load preliminary drive.

5.1.1 Rated Preliminary Drive

The rated preliminary drive is preliminary drive of the piezoelectric element by using a voltage waveform having a rated voltage and a rated frequency equivalent to those under the drive condition of the piezoelectric element during the EUV light generation process so that a temperature equivalent to the piezoelectric-unit temperature during the EUV light generation process is achieved before the duty adjustment process. Rated conditions suitable for EUV light generation are predetermined for the application voltage and frequency of square wave applied to the piezoelectric element during the EUV light generation process. The rated application voltage is referred to as "rated voltage", and the rated frequency is referred to as "rated frequency". An operation condition that the piezoelectric element is driven by application, to the piezoelectric element, of a voltage waveform having the rated voltage and the rated frequency is referred to as a rated operation condition. Drive of the piezoelectric element under the rated operation condition is referred to as a rated operation. In other words, the rated preliminary drive is the rated operation. Since the duty of square wave applied to the piezoelectric element during the EUV light generation process is determined through the duty adjustment process, the duty value is arbitrary for the rated operation condition and the rated operation. The duty of square wave used in the preliminary drive and the duty of square wave used in the rated operation during the EUV light generation process may be equal to each other or may be different from each other.

The temperature of the piezoelectric unit is increased in advance to a temperature substantially equal to that during the EUV light generation process by performing the rated preliminary drive before starting the duty adjustment. The difference in the temperature of the piezoelectric element between during the duty adjustment process and during the EUV light generation process can be reduced by performing the duty adjustment after performing the rated preliminary drive.

However, in the rated preliminary drive, the piezoelectric-unit temperature decreases by 1° C. approximately in a short time when the preliminary drive is switched to the duty adjustment, and thus the difference in the temperature of the piezoelectric element between during the duty adjustment process and during the EUV light generation process is not completely eliminated.

Figure 8:
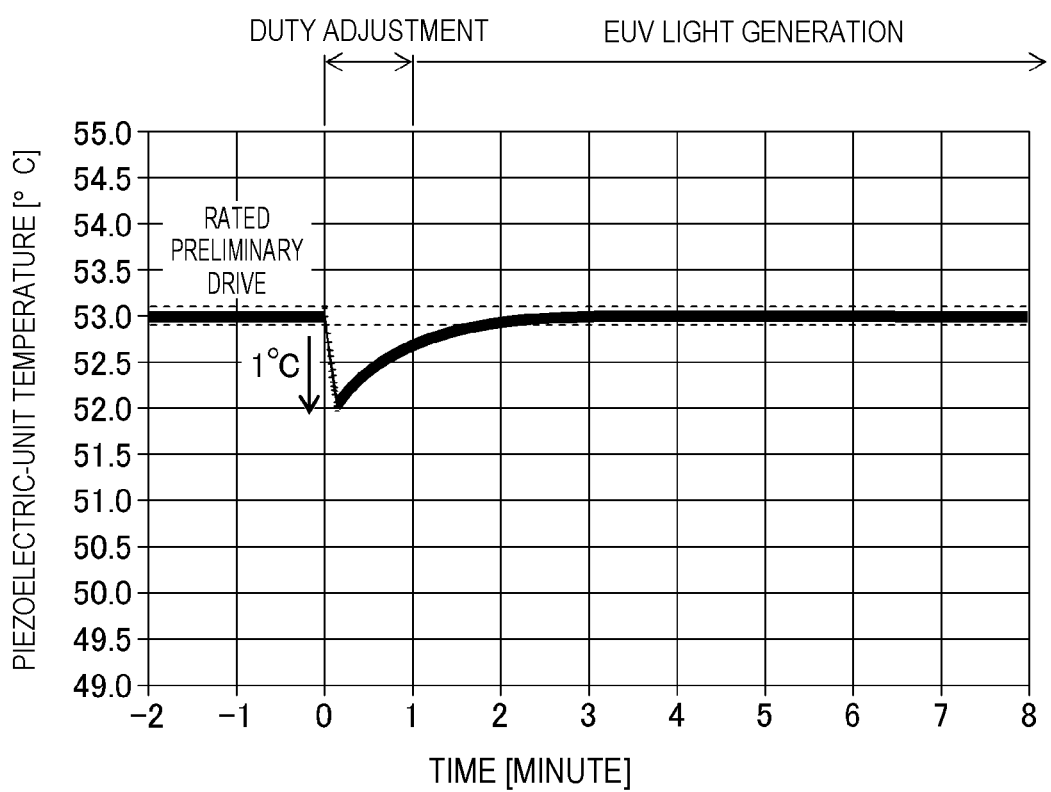
FIG. 8 is a graph illustrating overview of change of the temperature of the piezoelectric unit when rated preliminary drive is performed before a duty adjustment process.

FIG. 8 is a graph illustrating overview of change of the piezoelectric-unit temperature when the rated preliminary drive is performed before the duty adjustment process. In FIG. 8, the piezoelectric-unit temperature while increase of the temperature of the piezoelectric unit during the EUV light generation process is saturated is 53.0° C. approximately. The temperature range illustrated with dashed lines in FIG. 8 indicates an allowable range of the piezoelectric-unit temperature while increase of the temperature of the piezoelectric unit during the EUV light generation process is saturated. The allowable range is an exemplary reference temperature range.

The piezoelectric-unit temperature during the rated preliminary drive can become a temperature in the reference temperature range by performing the rated preliminary drive as preliminary drive before the duty adjustment process. When the rated preliminary drive is switched to the duty adjustment, the piezoelectric-unit temperature decreases by 1° C. approximately and then gradually increases due to drive of the piezoelectric element during the duty adjustment process. The piezoelectric-unit temperature at the end of the duty adjustment is lower than the reference temperature range.

Figure 9:
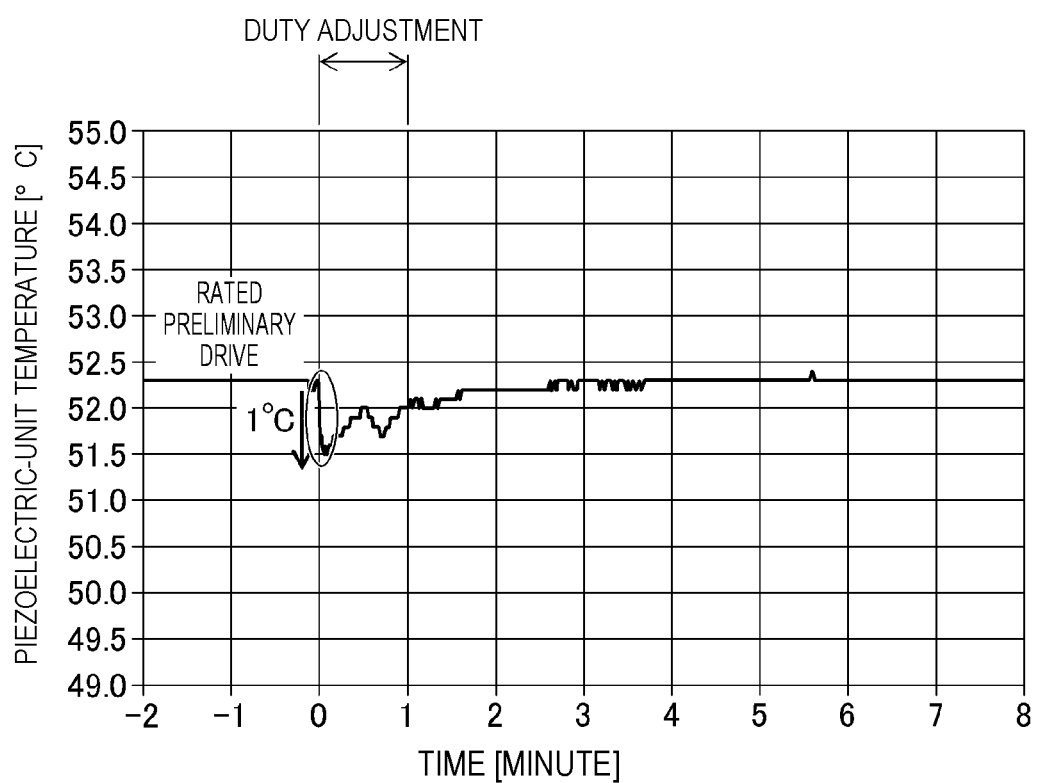
FIG. 9 is a graph illustrating change of the temperature of the piezoelectric unit, which was actually measured when the rated preliminary drive was performed before the duty adjustment process.
Figure 10:
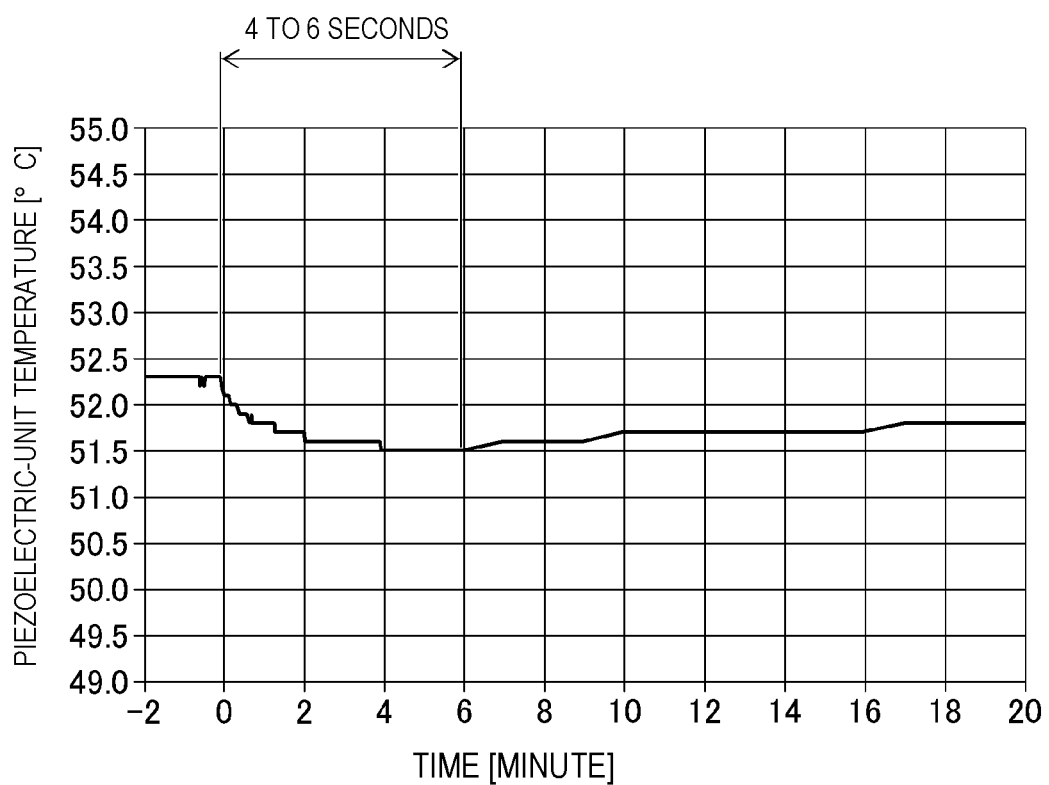
FIG. 10 is a graph illustrating part of the graph illustrated in FIG. 9 in detail with a different scale of the time axis.

FIG. 9 is a graph illustrating change of the piezoelectric-unit temperature which was actually measured when the rated preliminary drive was performed before the duty adjustment process. FIG. 10 is a graph as part of the graph illustrated in FIG. 9 for an initial time range of the duty adjustment process with different scale units on the time axis.

As indicated in the graphs in FIGS. 9 and 10, initial temperature decrease of the duty adjustment process after the rated preliminary drive occurs in four to six seconds after the start of the duty adjustment process.

5.1.2 High-Load Preliminary Drive

The high-load preliminary drive is a method more effective than the rated preliminary drive. The high-load preliminary drive is preliminary drive of the piezoelectric element under a condition that a drive load on the piezoelectric element is higher that of the rated operation condition before the duty adjustment process. The piezoelectric-unit temperature is increased in advance to a temperature higher than the temperature during the EUV light generation process by performing the high-load preliminary drive before starting the duty adjustment. Accordingly, the difference in the temperature of the piezoelectric element between during the duty adjustment process and during the EUV light generation process can be further reduced.

The condition that the drive load on the piezoelectric element is higher than the rated operation condition is a condition that at least one of the application voltage and the frequency is higher than that of the rated operation condition. The operation of driving the piezoelectric element under the condition that the drive load on the piezoelectric element is higher than the rated operation condition is referred to as "high-load operation".

Figure 11:
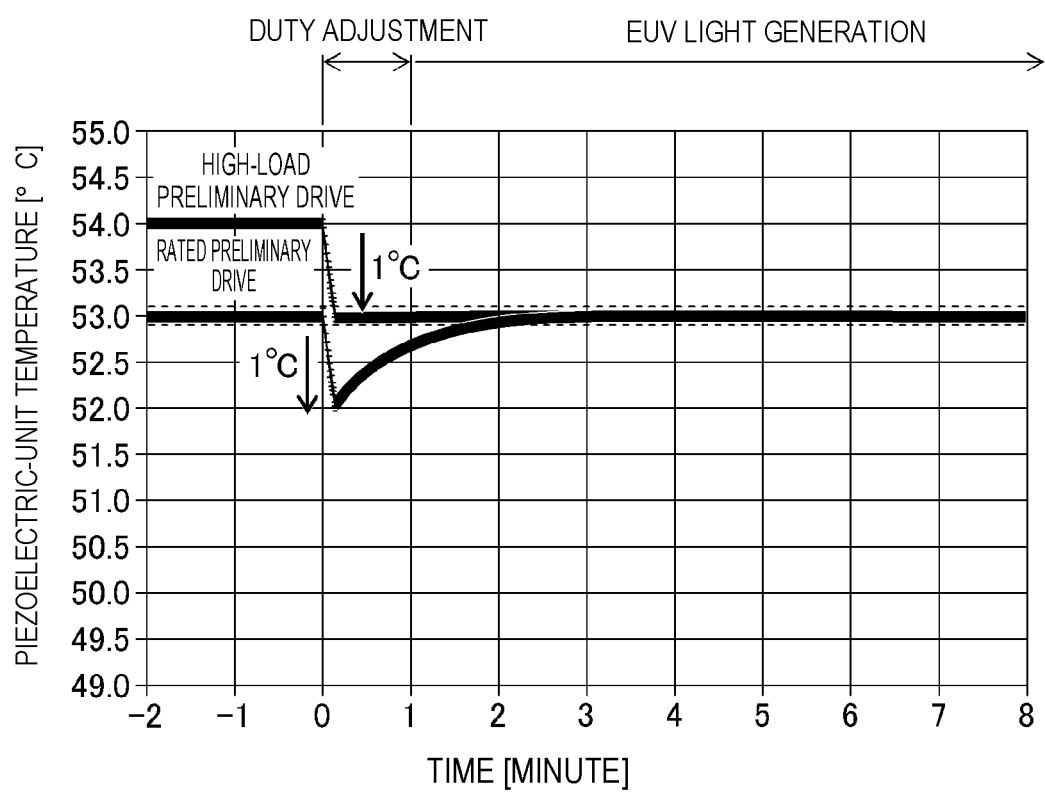
FIG. 11 is a graph illustrating overview of change of the temperature of the piezoelectric unit when high-load preliminary drive is performed before the duty adjustment process.

FIG. 11 is a graph illustrating overview of change of the piezoelectric-unit temperature when the high-load preliminary drive is performed before the duty adjustment process. FIG. 11 includes the graph in FIG. 8 when the rated preliminary drive is performed.

In the example illustrated in FIG. 11, when high-load rated preliminary drive is performed as the preliminary drive before the duty adjustment process, the piezoelectric-unit temperature during the high-load preliminary drive can exceed the reference temperature range. When the high-load preliminary drive is switched to the duty adjustment, the piezoelectric-unit temperature decreases by 1° C. approximately, and the piezoelectric-unit temperature during the duty adjustment process is in the reference temperature range.

5.2 Configuration

Figure 12:
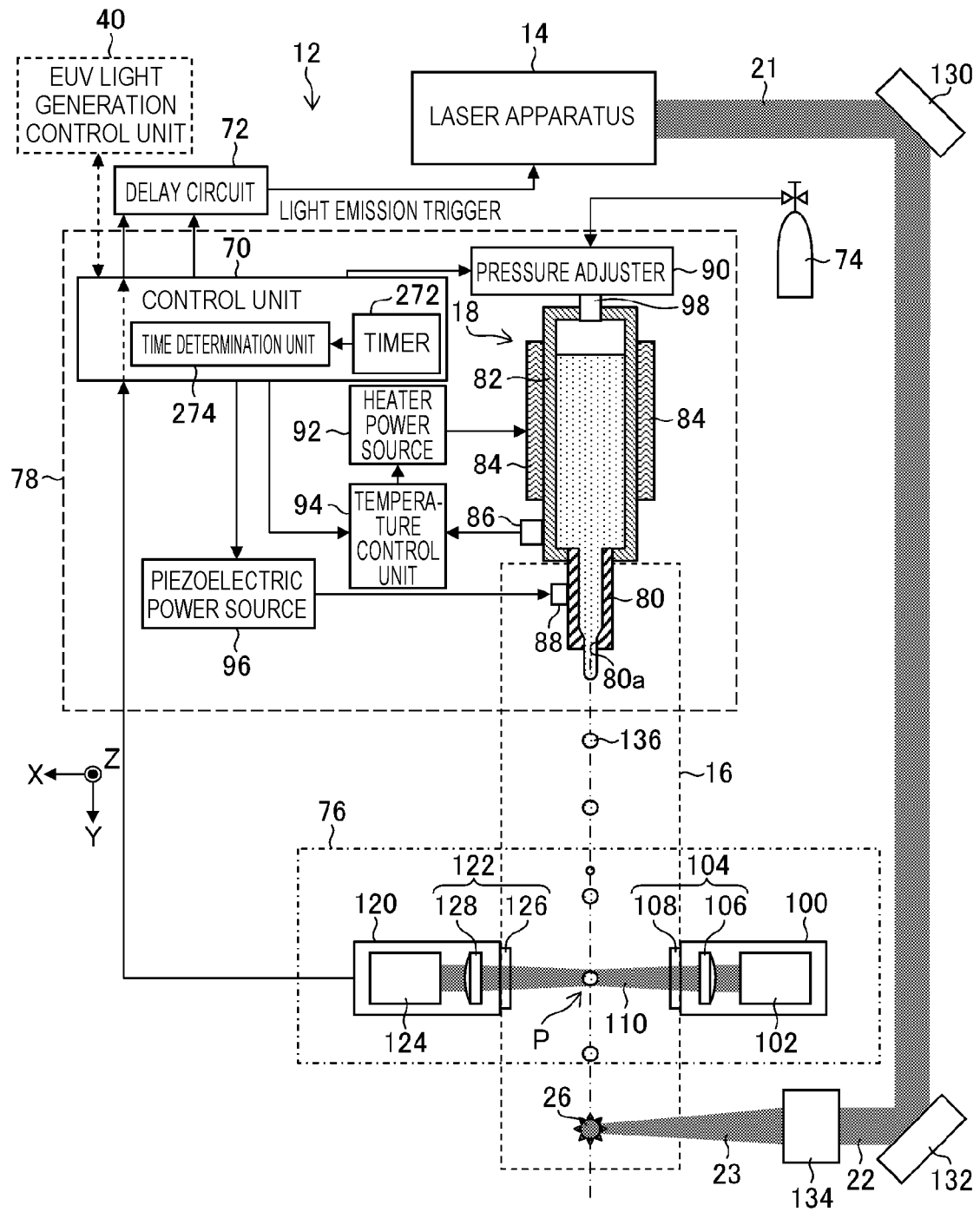
FIG. 12 is a diagram schematically illustrating the configuration of an EUV light generation device according to Embodiment 1.

FIG. 12 is a diagram schematically illustrating the configuration of the EUV light generation device according to Embodiment 1. The following describes any difference of FIG. 12 from FIG. 3.

The EUV light generation device 12 according to Embodiment 1 includes a timer 272 and a time determination unit 274. The timer 272 measures the operation time of the preliminary drive. In the present example, the timer 272 measures the operation time of the high-load operation. The time determination unit 274 determines whether the operation time of the preliminary drive is equal to or longer than a defined time set in advance. The time determination unit 274 of the present example determines whether the operation time of the high-load operation measured by the timer 272 is equal to or longer than the defined time set in advance.

The timer 272 and the time determination unit 274 are each disposed inside or outside the control unit 70. FIG. 12 illustrates an example in which the control unit 70 includes the timer 272 and the time determination unit 274. The timer 272 and the time determination unit 274 may be each configured by using hardware or software.

5.3 Operation

The EUV light generation device 12 according to Embodiment 1 performs the high-load operation before performing the duty adjustment. The time determination unit 274 determines whether the operation time of the high-load operation is equal to or longer than the defined time based on the time information obtained from the timer 272. The EUV light generation device 12 can perform the duty adjustment when the operation time of the high-load operation has become equal to or longer than the defined time.

Figure 13:
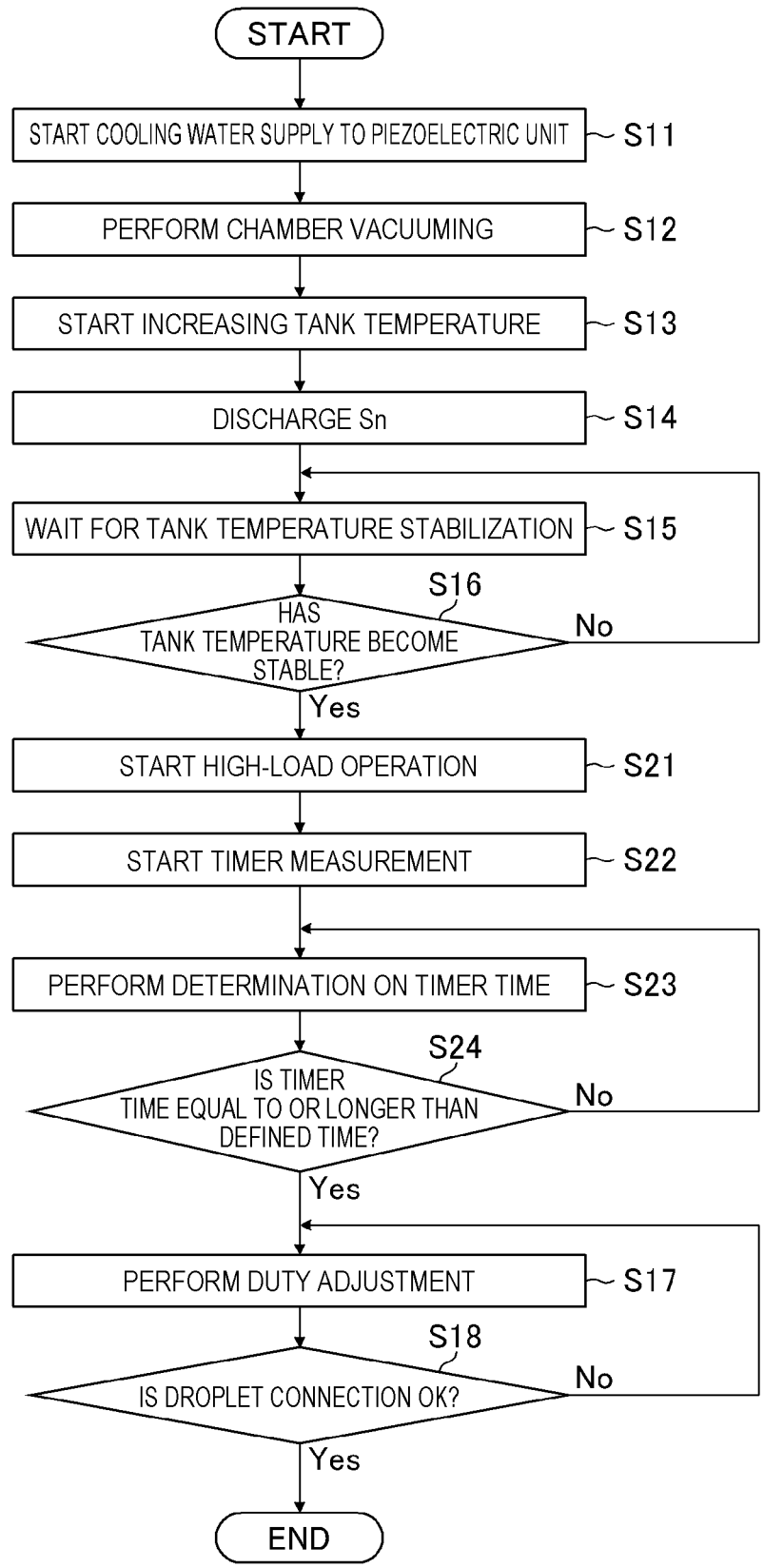
FIG. 13 is a flowchart illustrating the process of adjusting a drive condition of a piezoelectric element in the EUV light generation device according to Embodiment 1.

FIG. 13 is a flowchart illustrating the process of adjusting the drive condition of the piezoelectric element in the EUV light generation device according to Embodiment 1. Any step in FIG. 13 common to the flowchart illustrated in FIG. 6 is denoted by a step number identical to that in FIG. 6. The following describes any difference from the flowchart illustrated in FIG. 6.

The flowchart illustrated in FIG. 13 additionally includes steps S21 to S24 before the duty adjustment process (step S17).

At step S21, the control unit 70 starts the high-load operation of the piezoelectric element. In addition, the control unit 70 outputs a measurement start command to the timer 272.

At step S22, the timer 272 starts time measurement in accordance with the measurement start command. The timer 272 measures the operation time of the high-load operation. In addition, the control unit 70 outputs a determination command to the time determination unit 274.

At step S23, the time determination unit 274 determines whether the time of the timer 272 is equal to or longer than a defined time and transfers a result of the determination to the control unit 70. The defined time is, for example, three minutes or longer, preferably five minutes or longer, more preferably 10 minutes or longer. It is desirable that a time taken for saturation of increase of the temperature of the piezoelectric unit due to drive of the piezoelectric element 202 is determined by preliminary experiment or the like in advance, and the defined time is set to be an operation time equal to or longer than the time taken for saturation of the piezoelectric-unit temperature.

At step S24, the control unit 70 determines whether the time of the timer 272 is equal to or longer than the defined time based on the determination result from the time determination unit 274. When negative determination is obtained at step S24, in other words, when the time measured by the timer 272 is shorter than the defined time, the control unit 70 continues the high-load operation and returns to step S23.

When positive determination is obtained at step S24, in other words, when the time measured by the timer 272 is equal to or longer than the defined time, the control unit 70 proceeds to the duty adjustment process at step S17.

The process of timer time determination processing including steps S23 and S24 is desirably performed right before the duty adjustment (step S17). In other words, the duty adjustment is desirably started right after the high-load operation as the preliminary drive is performed for the defined time or longer. The timing "right after" means, for example, in six seconds or less after the high-load operation ends, preferably four seconds or less, or before the piezoelectric-unit temperature decreases to a temperature lower than the reference temperature range of the piezoelectric-unit temperature during the EUV light generation process.

Step S21 of "start high-load operation" and step S22 of "start timer measurement" may be started before step S23 of "perform determination on timer time". Steps S21 and S22 are not limited to after step S16 but may be started at an appropriate timing earlier than step S16. For example, the high-load operation may be started before step S13 of "start increasing tank temperature". Alternatively, for example, the high-load operation may be started before step S12 of "perform chamber vacuuming".

5.4 Specific Example of Duty Adjustment Processing

Figure 14:
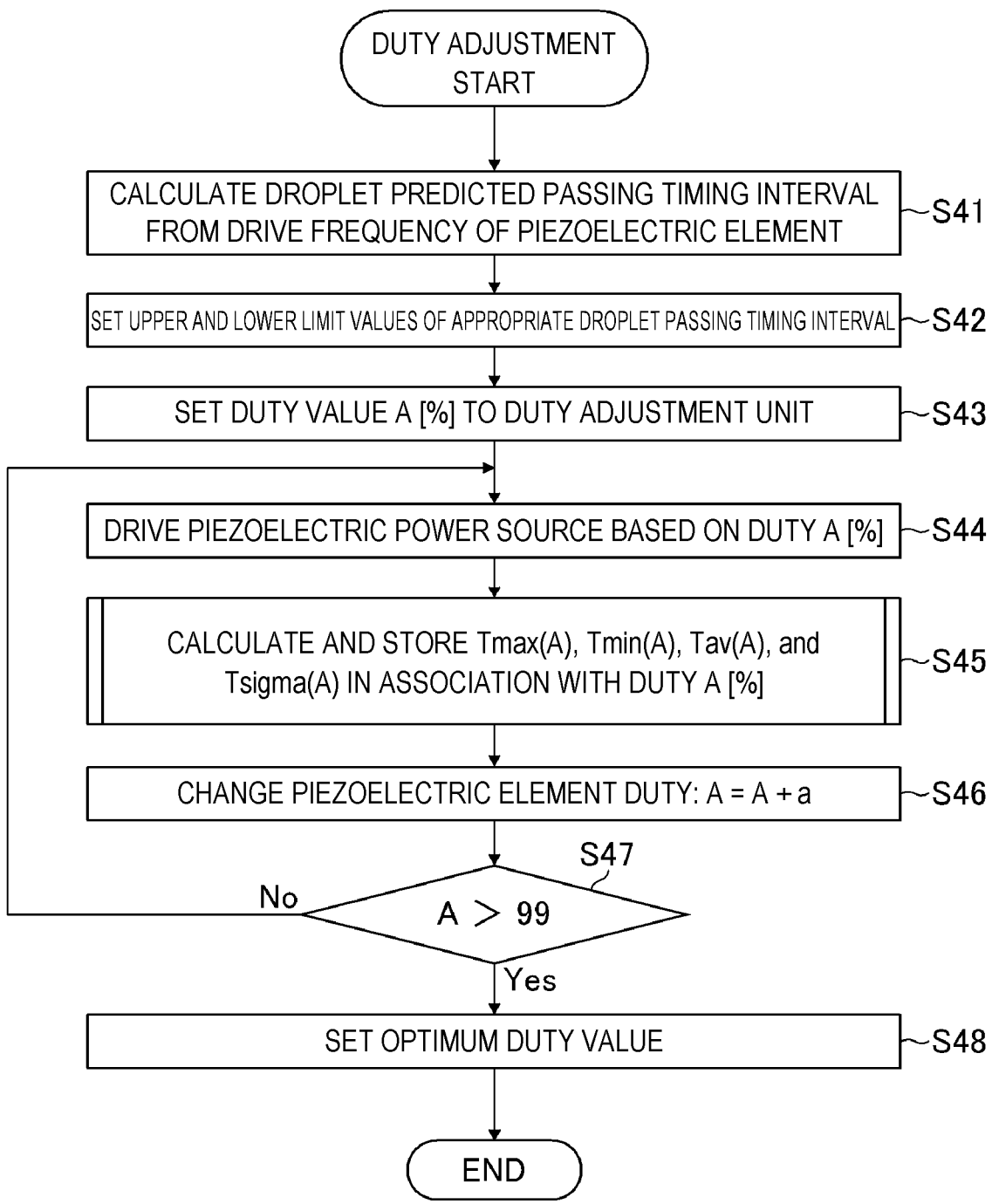
FIG. 14 is a flowchart illustrating exemplary duty adjustment processing.

FIG. 14 is a flowchart illustrating exemplary duty adjustment processing. The duty adjustment processing illustrated in FIG. 14 sets duty values at steps of a predetermined unit change amount for substantially the entire variable range of the duty, acquires data of a droplet interval at each duty value, and determines an optimum operation duty value from this measurement result. For example, in the duty adjustment, the duty value is sequentially changed at steps of 0.2% through the range of duty 1% to 99%, and an optimum duty value is determined based on a result of measurement of the droplet interval at each duty value.

The control unit 70 includes a duty adjustment unit. The duty adjustment unit may be a circuit configured to output a signal to the piezoelectric power source 96 based on a duty value specified by the control unit 70. Alternatively, the duty adjustment unit may be configured as an external device such as a function generator configured to supply a signal waveform to the piezoelectric power source 96 based on a duty value specified by the control unit 70.

When the duty adjustment processing illustrated in FIG. 14 is started, the control unit 70 calculates a predicted passing timing interval of droplets from the drive frequency of the piezoelectric element 202 at step S41. The "predicted passing timing interval" is the time interval between droplet passing timings predicted through calculation from the drive frequency of the piezoelectric element. The predicted passing timing interval serves as a guide for an appropriate passing time interval of droplets.

At step S42, the control unit 70 may set upper and lower limit values of the appropriate passing timing interval of droplets. For example, the control unit 70 may set the upper and lower limit values to be values of the predicted passing timing interval calculated at step S41±15%. Thus, the control unit 70 may set the range of the predicted passing timing interval±15% to be an appropriate range of the droplet passing timing interval. The appropriate range of the droplet passing timing interval can be a range allowed as the appropriate passing time interval of droplets.

At step S43, the control unit 70 sets the duty value of the duty adjustment unit to be A [%]. The value "A" is a variable parameter indicating the duty value. For example, the control unit 70 may set A=1[%] as an initial value.

At step S44, the duty adjustment unit can drive the piezoelectric power source 96 based on the set duty A [%]. When the piezoelectric power source 96 is driven based on the set duty A [%], a droplet is generated, and a passing timing signal is output from the droplet detection device 76.

When having received the passing timing signal, the control unit 70 measures each passing timing interval T(1), T(2), ..., T(N) between droplets. The value N is an optional integer that indicates the number of times that the passing timing interval is measured, and can be determined in advance. For example, N may be between 3 to 50 inclusive. As an example, N may be 10. The passing timing interval T(k) can be defined to be the time interval t(k+1)−t(k) between the k-th droplet passing timing t(k) and the (k+1)-th droplet passing timing t(k+1) for an integer k equal to or larger than one.

At step S45, the control unit 70 stores the measured passing timing intervals T(1), T(2), ..., T(N). In addition, the control unit 70 calculates, from each passing timing interval T(1), T(2), ..., T(N), a maximum passing timing interval Tmax, a minimum passing timing interval Tmin, a passing timing interval average value Tav, and a passing timing interval variance Tsigma. The variance Tsigma may be the 3σ value of standard deviation. The 3σ value of standard deviation is the value of "3×σ" where σ represents the standard deviation.

At step S45, the control unit 70 stores the calculated Tmax, Tmin, Tav, and Tsigma as Tmax(A), Tmin(A), Tav (A), and Tsigma(A) in association with the duty A [%]. Processing at step S45 will be described later with reference to FIG. 15.

For example, the control unit 70 sequentially changes the set duty A from A=1 to 99 [%] by each step of a unit change amount a=0.2 [%], and performs the processing at steps S44 and S45 for each duty value.

Specifically, at step S46, the control unit 70 changes the duty A of the piezoelectric power source 96 that drives the piezoelectric element 202 to "A+a". Through step S46, the value of "A+a" is newly set as the duty A. After step S46, the control unit 70 proceeds to step S47.

At step S47, the control unit 70 may determine whether the duty A exceeds 99 [%]. When having determined that the duty A is equal to or smaller than 99 [%] at step S47, the control unit 70 returns to step S44. The processing at steps S44 to S47 is repeated until the duty A exceeds 99 [%].

When having determined that the duty A exceeds 99 [%] at step S47, the control unit 70 proceeds to step S48.

At step S48, the control unit 70 determines an optimum value of the duty based on the data stored in association with each duty A [%], and sets the determined optimum value to the duty adjustment unit as an optimum duty value.

The control unit 70 extracts, from the stored data, a group of data having Tmax(A), Tmin(A), and Tav(A) in the appropriate range of the droplet passing timing interval, and determines the optimum value to be the duty A having the minimum Tsigma(A) in the extracted group of data. The appropriate range of the droplet passing timing interval may be a range defined by the upper and lower limit values determined at step S42.

After the optimum duty value is set at step S48, the control unit 70 ends the duty adjustment processing in FIG. 14.

Thereafter, the duty adjustment unit can drive the piezoelectric power source 96 based on the set duty.

As described above, the control unit 70 changes the duty value at step S46, and performs the processing at step S45 for each of a plurality of duty values.

Figure 15:
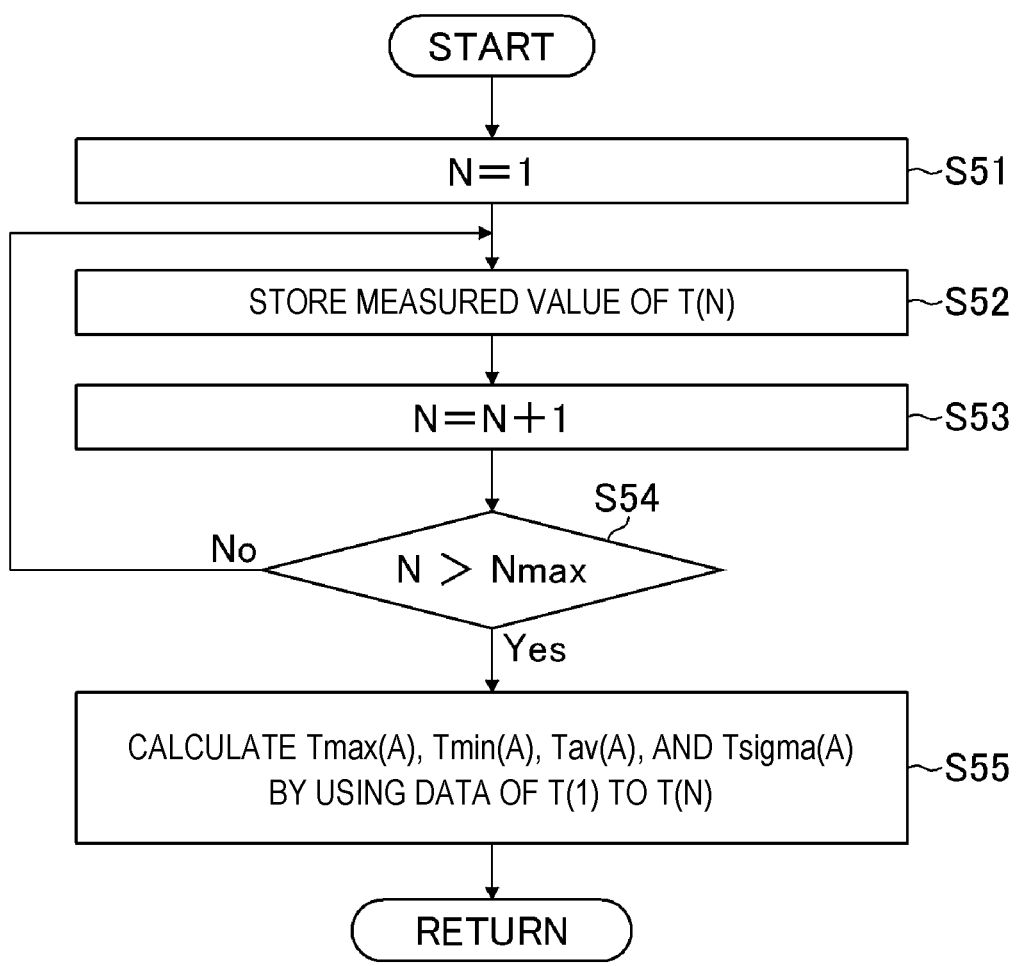
FIG. 15 is a flowchart illustrating exemplary processing at step S45 in FIG. 14.

FIG. 15 is a flowchart illustrating exemplary processing at step S45 in FIG. 14. At step S51 in FIG. 15, the control unit 70 may set the parameter N to be the initial value of N=1.

At step S52, the control unit 70 stores a measured value of the passing timing interval T(N).

At step S53, the control unit 70 increments the value of N by "+1", and newly sets the value of "N+1" as the value of the parameter N.

At step S54, the control unit 70 determines whether the value of N exceeds a defined value Nmax determined in advance. The value Nmax may be set to be an optional integer larger than the maximum number of times of measurement of the passing timing interval. For example, Nmax may be set to be an appropriate value in the range of 4 to 51.

When having determined that N Nmax holds at step S54, the control unit 70 returns to step S52.

When having determined that N>Nmax holds at step S54, the control unit 70 proceeds to step S55.

At step S55, the control unit 70 calculates Tmax(A), Tmin(A), Tav(A), and Tsigma(A) by using the data of T(1) to T(N). The control unit 70 stores the calculated Tmax(A), Tmin(A), Tav(A), and Tsigma(A).

After step S55, the control unit 70 returns to the flowchart in FIG. 14.

In the examples illustrated in FIGS. 14 and 15, the adjustment range of the duty is 1 to 99%. However, the adjustment range of the duty is not limited to this example and may be set to be an appropriate range. The adjustment range of the duty adjustment does not necessarily need to be the entire variable range of the duty nor substantially the entire variable range but may be part of the variable range. For example, the adjustment range of the duty may be 50 to 99%. The unit change amount of the duty value is not limited to 0.2% but may be set to be an appropriate value such as 1%.

5.5 Effect

The EUV light generation device according to Embodiment 1 can perform the duty adjustment while the piezoelectric-unit temperature is sufficiently increased by performing "duty adjustment" right after performing the high-load operation for the defined time or longer. As a result, the piezoelectric-unit temperature during the duty adjustment process and the piezoelectric-unit temperature during the EUV light generation process following duty value setting are substantially equal to each other. Thus, it is possible to maintain droplet connection during the EUV light generation process by using square wave with the duty value set based on a result of the duty adjustment.

6. Embodiment 2

6.1 Configuration

Figure 16:
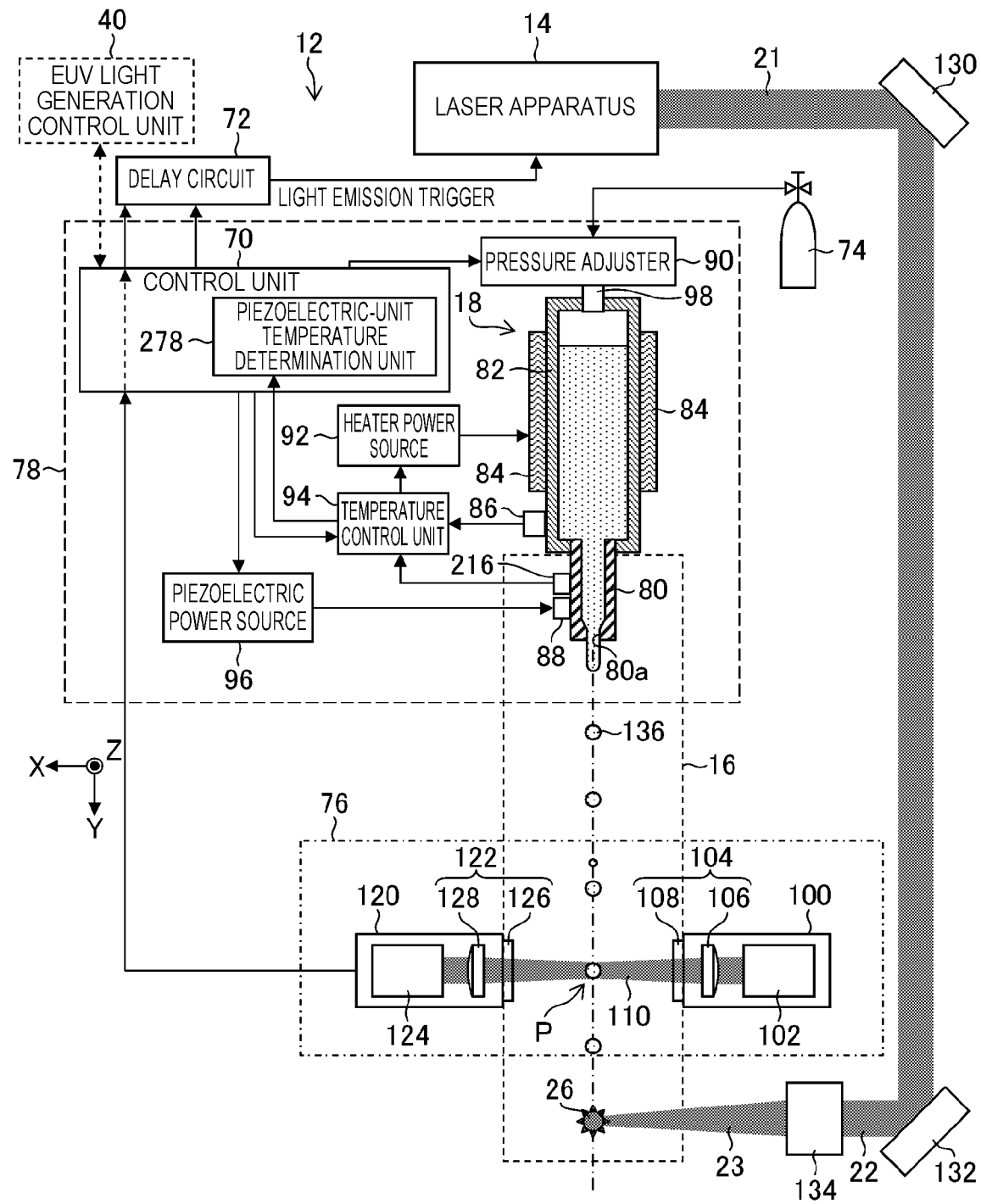
FIG. 16 is a diagram schematically illustrating the configuration of the EUV light generation device according to Embodiment 2.

FIG. 16 is a diagram schematically illustrating the configuration of the EUV light generation device according to Embodiment 2. The following describes any difference of FIG. 16 from FIG. 12.

The EUV light generation device 12 includes the temperature sensor 216 configured to measure the piezoelectric-unit temperature, and a piezoelectric-unit temperature determination unit 278.

The temperature control unit 94 acquires piezoelectric-unit temperature information from the temperature sensor 216 and relays the piezoelectric-unit temperature information to the piezoelectric-unit temperature determination unit 278.

To determine end of the high-load operation of the piezoelectric element 202, the piezoelectric-unit temperature determination unit 278 determines whether the piezoelectric-unit temperature transferred from the temperature control unit 94 matches a defined condition that is defined in advance.

The piezoelectric-unit temperature determination unit 278 is disposed inside or outside the control unit 70. FIG. 16 illustrates an example in which the control unit 70 includes the piezoelectric-unit temperature determination unit 278. The piezoelectric-unit temperature determination unit 278 may be configured by using hardware or software.

6.2 Operation

The EUV light generation device 12 according to Embodiment 2 performs the high-load operation before performing the duty adjustment. The piezoelectric-unit temperature determination unit 278 determines whether the piezoelectric-unit temperature matches the defined condition based on the temperature information obtained from the temperature sensor 216. When the piezoelectric-unit temperature matches the defined condition, the EUV light generation device 12 performs "duty adjustment".

Figure 17:
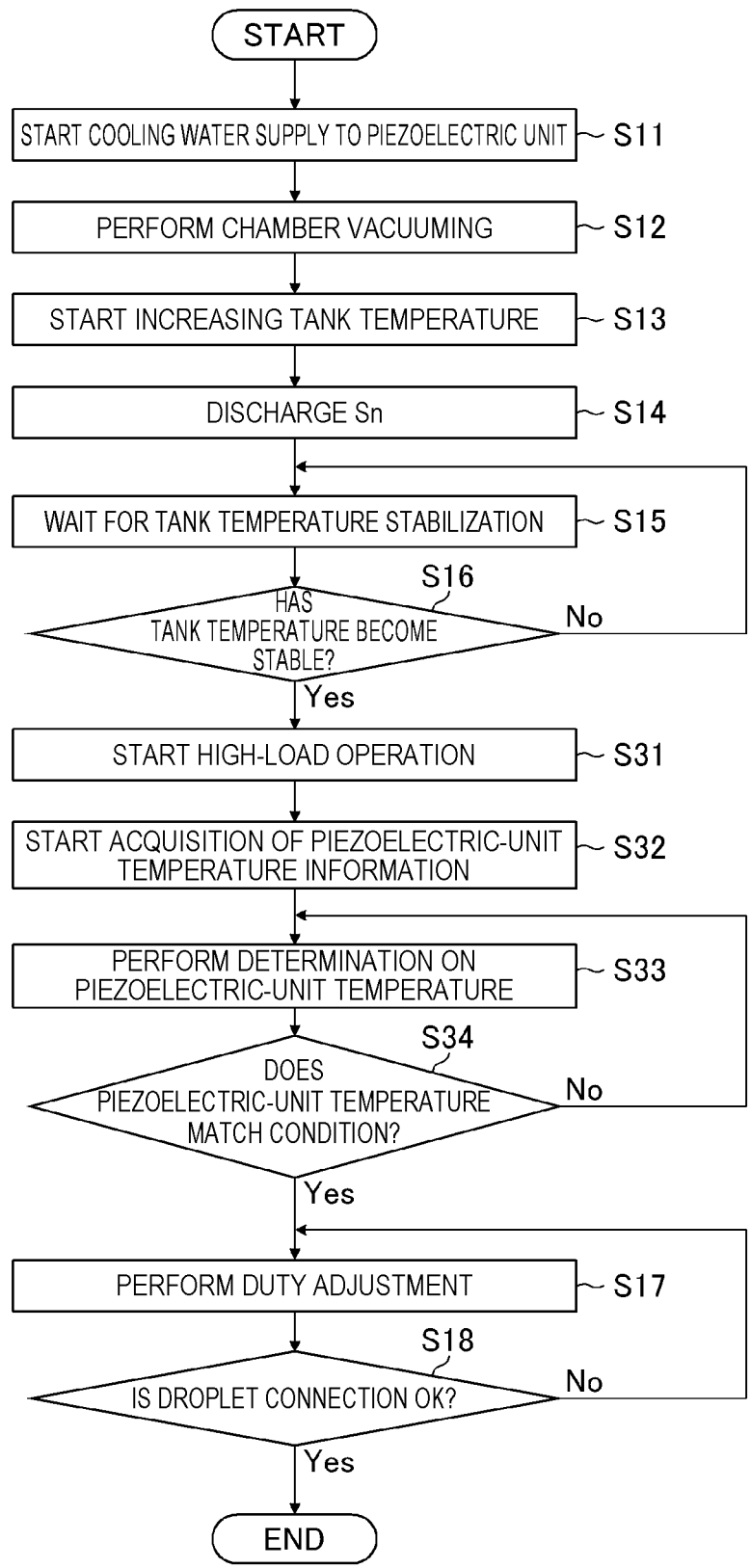
FIG. 17 is a flowchart illustrating the process of adjusting the drive condition of the piezoelectric element in an EUV light generation device according to Embodiment 2.

FIG. 17 is a flowchart illustrating the process of adjusting the drive condition of the piezoelectric element in the EUV light generation device according to Embodiment 2. Any step in FIG. 17 common to the flowchart illustrated in FIG. 6 is denoted by a step number identical to that in FIG. 6. The following describes any difference from FIG. 6.

The flowchart illustrated in FIG. 17 additionally includes steps S31 to S34 before the duty adjustment process (step S17).

At step S31, the control unit 70 starts the high-load operation of the piezoelectric element 202.

At step S32, the piezoelectric-unit temperature determination unit 278 starts acquisition of piezoelectric-unit temperature information from the temperature control unit 94. In addition, the control unit 70 outputs a determination command to the piezoelectric-unit temperature determination unit 278.

At step S33, the piezoelectric-unit temperature determination unit 278 determines whether the piezoelectric-unit temperature matches the defined condition, and transfers a result of the determination to the control unit 70. The defined condition of the piezoelectric-unit temperature is such that, for example, the piezoelectric-unit temperature in latest one minute satisfies "Max−Min≤0.2° C.". Max represents a maximum value of the piezoelectric-unit temperature measured in a predetermined time range. Min represents a minimum value of the piezoelectric-unit temperature measured in the predetermined time range. The "latest one minute" is an exemplary "predetermined time range". "Max−Min 0.2° C." indicates that the difference between the maximum and minimum values of the measured piezoelectric-unit temperature is equal to or smaller than 0.2° C. The defined condition of the piezoelectric-unit temperature is preferably such that the piezoelectric-unit temperature in latest three minutes satisfies "Max−Min≤0.2° C.". The defined condition of the piezoelectric-unit temperature is more preferably such that the piezoelectric-unit temperature in latest five minutes satisfies "Max−Min≤0.2° C.". These conditions indicate that increase of the temperature of the piezoelectric unit is saturated and the piezoelectric-unit temperature is substantially stable.

Alternatively, the defined condition of the piezoelectric-unit temperature is such that the piezoelectric-unit temperature is in the range of a definition temperature ±0.1° C. The definition temperature is higher than the piezoelectric-unit temperature during the EUV light generation process, and is a numerical value defined up to the tenth place in the range of 40.0° C. to 70.0° C.

At step S34, the control unit 70 determines whether the piezoelectric-unit temperature matches the defined condition based on the determination result from the piezoelectric-unit temperature determination unit 278. When negative determination is obtained at step S34, in other words, when the piezoelectric-unit temperature does not match the defined condition, the control unit 70 continues the high-load operation and returns to step S33.

When positive determination is obtained at step S34, in other words, when the piezoelectric-unit temperature matches the defined condition, the control unit 70 proceeds to the duty adjustment process at step S17.

The process of piezoelectric-unit temperature determination processing including steps S33 and S34 is preferably performed right before the duty adjustment (step S17). Specifically, the duty adjustment is desirably started right after the high-load operation in which a piezoelectric-unit temperature satisfying the defined condition is reached ends. Similarly to Embodiment 1, the timing "right after" means, for example, in six seconds or less after the high-load operation ends, preferably in four seconds or less, or before the piezoelectric-unit temperature decreases to a temperature lower than the reference temperature range of the piezoelectric-unit temperature during the EUV light generation process.

Step S31 of "start high-load operation" and step S32 of "start piezoelectric-unit temperature measurement" may be started before step S33 of "perform determination on piezoelectric-unit temperature". Steps S31 and S32 are not limited to after step S16 but may be started at an appropriate timing earlier than step S16. For example, the high-load operation may be started before step S13 of "start increasing tank temperature". Alternatively, for example, the high-load operation may be started before step S12 of "perform chamber vacuuming".

6.3 Effect

The EUV light generation device 12 according to Embodiment 2 performs the high-load operation until the piezoelectric-unit temperature matches the defined condition, and performs the duty adjustment right after ending the high-load operation. Accordingly, "duty adjustment" can be performed while the piezoelectric-unit temperature is sufficiently increased. As a result, the piezoelectric-unit temperature during the duty adjustment and the piezoelectric-unit temperature during the EUV light generation process following duty value setting are substantially equal to each other. Thus, it is possible to maintain droplet connection during the EUV light generation process by using square wave with the duty value set based on a result of the duty adjustment.

7. Embodiment 3

7.1 Configuration

Embodiments 1 and 2 describe examples in which "high-load preliminary drive" as the preliminary drive is performed, but "rated preliminary drive" may be employed in place of "high-load preliminary drive". In other words, "rated operation" may be performed in place of "high-load operation" in the description of Embodiments 1 and 2.

The EUV light generation device according to Embodiment 3 performs the rated preliminary drive as the preliminary drive. The configuration of the EUV light generation device according to Embodiment 3 is same as the configuration illustrated in FIG. 12. Difference from Embodiment 1 is as follows.

The timer 272 measures the operation time of the rated operation. The time determination unit 274 determines whether the operation time of the rated operation is equal to or longer than a defined time set in advance.

7.2 Operation

The EUV light generation device according to Embodiment 3 performs the rated operation before performing the duty adjustment. The time determination unit 274 determines whether the operation time of the rated operation is equal to or longer than the defined time based on the time information obtained from the timer 272. When the operation time of the rated operation is equal to or longer than the defined time, the EUV light generation device performs the duty adjustment.

The step of "start rated operation" is employed in place of step S21 in the flowchart illustrated in FIG. 13. The other content is same as that in Embodiment 1.

7.3 Effect

The EUV light generation device according to Embodiment 3 can perform the duty adjustment while the piezoelectric-unit temperature is sufficiently increased by performing the rated operation before performing the duty adjustment and by performing the duty adjustment right after performing the rated operation for the defined time or longer. As a result, the temperature difference between the piezoelectric-unit temperature during the duty adjustment process and the piezoelectric-unit temperature during the EUV light generation process following duty value setting decreases. Thus, it is possible to maintain droplet connection during the EUV light generation process by using square wave with the duty value set based on a result of the duty adjustment.

8. Embodiment 4

8.1 Configuration

The EUV light generation device according to Embodiment 4 performs the rated preliminary drive as the preliminary drive. The configuration of the EUV light generation device according to Embodiment 4 is same as that in FIG. 16. Difference from Embodiment 3 is as follows.

To determine end of the rated operation of the piezoelectric element 202, the piezoelectric-unit temperature determination unit 278 determines whether the piezoelectric-unit temperature transferred from the temperature control unit 94 matches a condition that is defined in advance.

8.2 Operation

The EUV light generation device according to Embodiment 4 performs the rated operation before performing the duty adjustment. The piezoelectric-unit temperature determination unit 278 determines whether the piezoelectric-unit temperature matches the defined condition based on the temperature information obtained from the temperature sensor 216. When the piezoelectric-unit temperature matches the defined condition, the EUV light generation device performs "duty adjustment".

The step of "start rated operation" is employed in place of step S31 in the flowchart illustrated in FIG. 17. The other content is same as that in Embodiment 2.

8.3 Effect

The EUV light generation device according to Embodiment 4 can perform the duty adjustment while the piezoelectric-unit temperature is sufficiently increased by performing the rated operation before performing the duty adjustment and by performing the duty adjustment right after performing the rated operation for the defined time or longer. As a result, the temperature difference between the piezoelectric-unit temperature during the duty adjustment process and the piezoelectric-unit temperature during the EUV light generation process following duty value setting decreases. Thus, it is possible to maintain droplet connection during the EUV light generation process by using square wave with the duty value set based on a result of the duty adjustment.

9. Exemplary Rated Operation Condition of Piezoelectric Element

Figure 18:
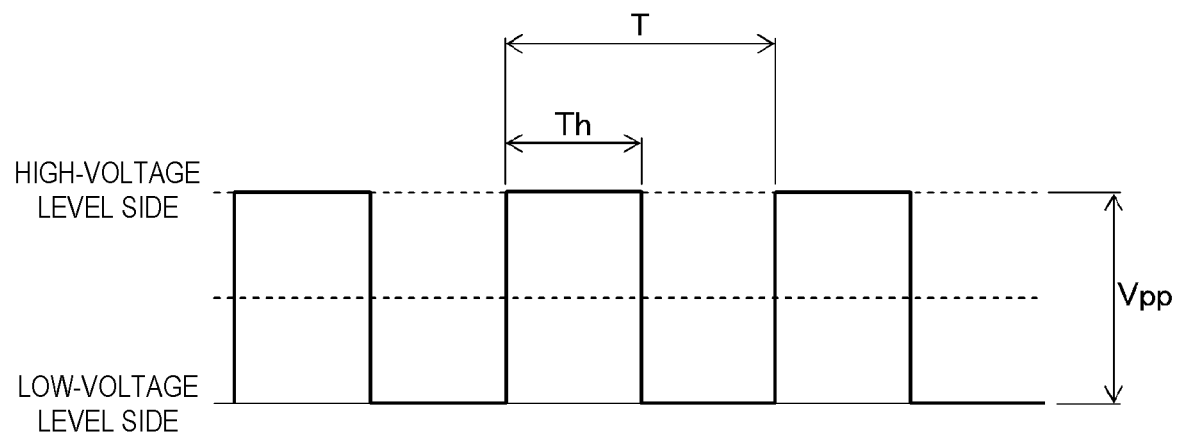
FIG. 18 is a waveform diagram illustrating an exemplary waveform of a drive voltage applied to the piezoelectric element in a rated operation.

FIG. 18 illustrates an exemplary waveform of drive voltage applied to the piezoelectric element during the rated operation. The rated operation condition of the piezoelectric element is as follows, for example.

Waveform: square wave (refer to FIG. 18)
Application voltage: Vpp=140 volts [V]
Frequency: 1/T=100 kilohertz [kHz]
Duty: 1.0% to 99.0% inclusive.

The application voltage of the rated operation condition is referred to as "rated voltage", and the frequency of the rated operation condition is referred to as "rated frequency".

10. Exemplary High-Load Operation Condition of Piezoelectric Element

The high-load operation condition is such that at least one of the application voltage and the frequency is numerically larger than that of the rated operation condition. Any other parameter may be same as that of the rated operation condition. The duty value may be different between the high-load operation condition and the rated operation condition.

10.1 Specific Example of High-Load Operation Condition that Application Voltage is Higher than Rated Operation Condition For example, in the high-load operation condition, the application voltage is equal to or higher than the rated voltage of the rated operation condition+20 volts [V]. The application voltage is preferably equal to or higher than the rated voltage+30 volts [V]. The application voltage is more preferably equal to or higher than the rated voltage+40 volts [V].

Figure 19:
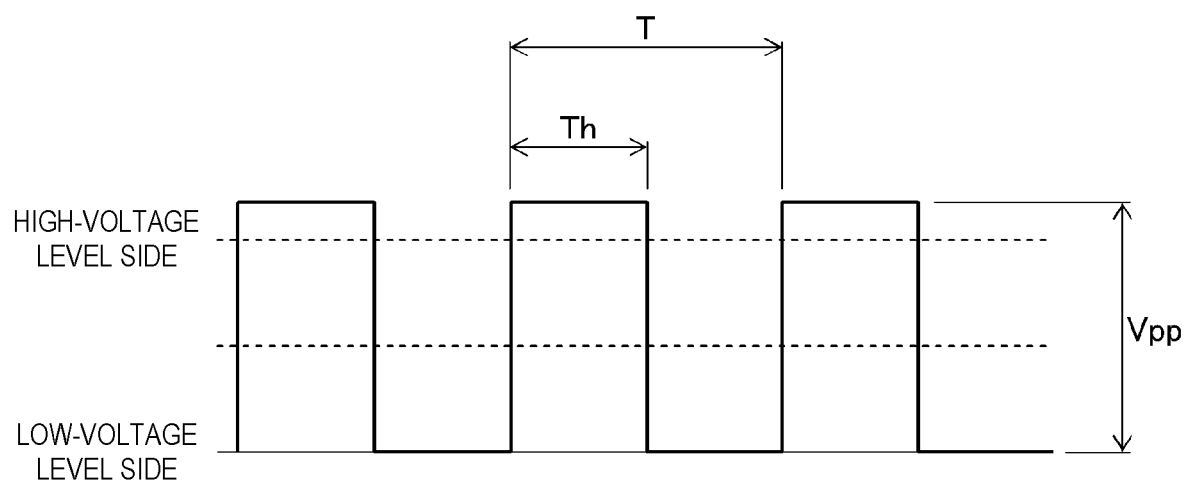
FIG. 19 is a waveform diagram illustrating Exemplary Waveform 1 of a drive voltage applied to the piezoelectric element in a high-load operation.

FIG. 19 illustrates Exemplary Waveform 1 of drive voltage applied to the piezoelectric element during the high-load operation. The high-load operation condition of the piezoelectric element is as follows, for example.

Waveform: square wave (refer to FIG. 19)
Application voltage: Vpp=rated voltage+20 volts [V] or higher
Frequency: 1/T=100 kilohertz [kHz]
Duty: 1.0% to 99.0% inclusive.

Figure 20:
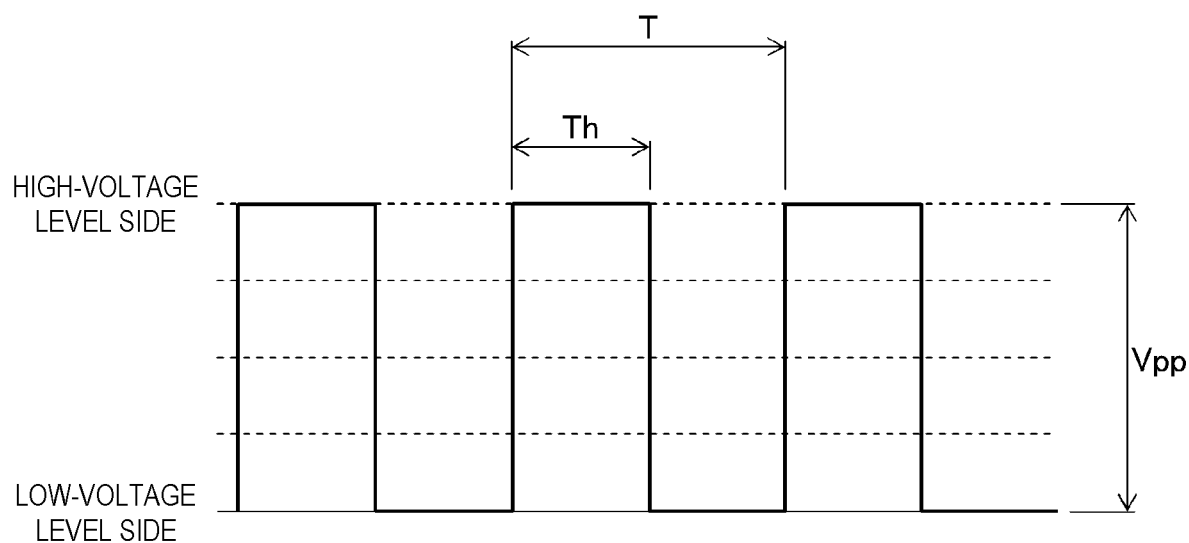
FIG. 20 is a waveform diagram illustrating Exemplary Waveform 2 of the drive voltage applied to the piezoelectric element in the high-load operation.

FIG. 20 illustrates Exemplary Waveform 2 of drive voltage applied to the piezoelectric element during the high-load operation. The high-load operation condition of the piezoelectric element is preferably as follows, for example.

Waveform: square wave (refer to FIG. 20)
Application voltage: Vpp=rated voltage+30 volts [V] or higher
Frequency: 1/T=100 kilohertz [kHz]
Duty: 1.0% to 99.0% inclusive.

Figure 21:
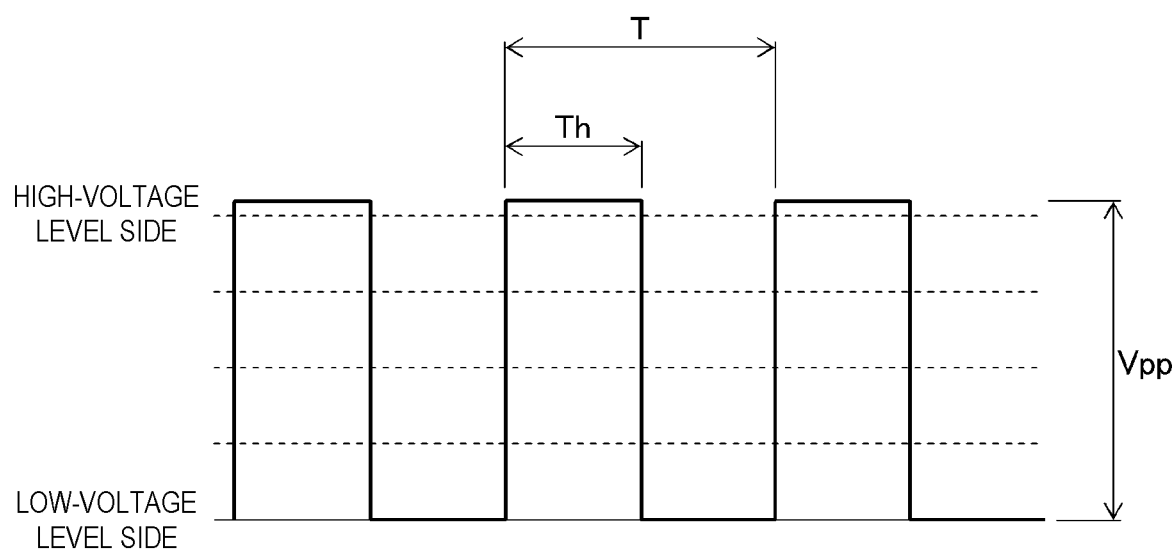
FIG. 21 is a waveform diagram illustrating Exemplary Waveform 3 of the drive voltage applied to the piezoelectric element in the high-load operation.

FIG. 21 illustrates Exemplary Waveform 3 of drive voltage applied to the piezoelectric element during the high-load operation. The high-load operation condition of the piezoelectric element is more preferably as follows, for example.

Waveform: square wave (refer to FIG. 21)
Application voltage: Vpp=rated voltage+40 volts [V] or higher
Frequency: 1/T=100 kilohertz [kHz]
Duty: 1.0% to 99.0% inclusive.

10.2 Specific Example of High-Load Operation Condition that Frequency is Higher than Rated Operation Condition Alternatively, for example, in the high-load operation condition, the frequency may be higher than the rated frequency or may be equal to or higher than the rated frequency of the rated operation condition+30 kilohertz [kHz]. The frequency is preferably equal to or higher than the rated frequency+50 kilohertz [kHz]. The frequency is more preferably is equal to or higher than the rated frequency+70 kilohertz [kHz]. When the rated frequency is 100 kilohertz [kHz], the high-load operation condition may be such that the frequency is equal to or higher than 130 kilohertz [kHz]. The frequency is preferably equal to or higher than 150 kilohertz [kHz]. The frequency is more preferably is equal to or higher than 170 kilohertz [kHz].

Figure 22:
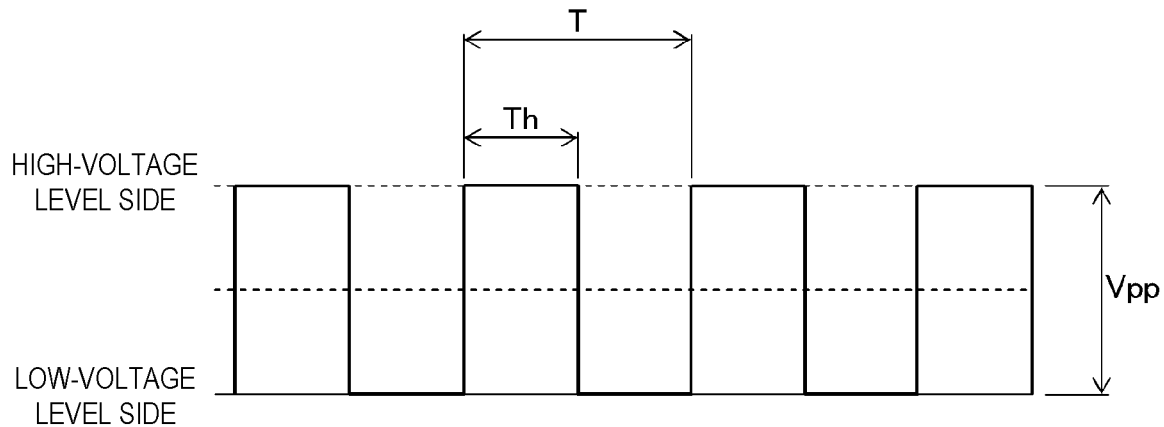
FIG. 22 is a waveform diagram illustrating Exemplary Waveform 4 of the drive voltage applied to the piezoelectric element in the high-load operation.

FIG. 22 illustrates Exemplary Waveform 4 of drive voltage applied to the piezoelectric element during the high-load operation. The high-load operation condition of the piezoelectric element is as follows, for example.

Waveform: square wave (refer to FIG. 22)
Application voltage: Vpp=140 volts [V]
Frequency: 1/T=130 kilohertz [kHz] or higher
Duty: 1.0% to 99.0% inclusive.

Figure 23:
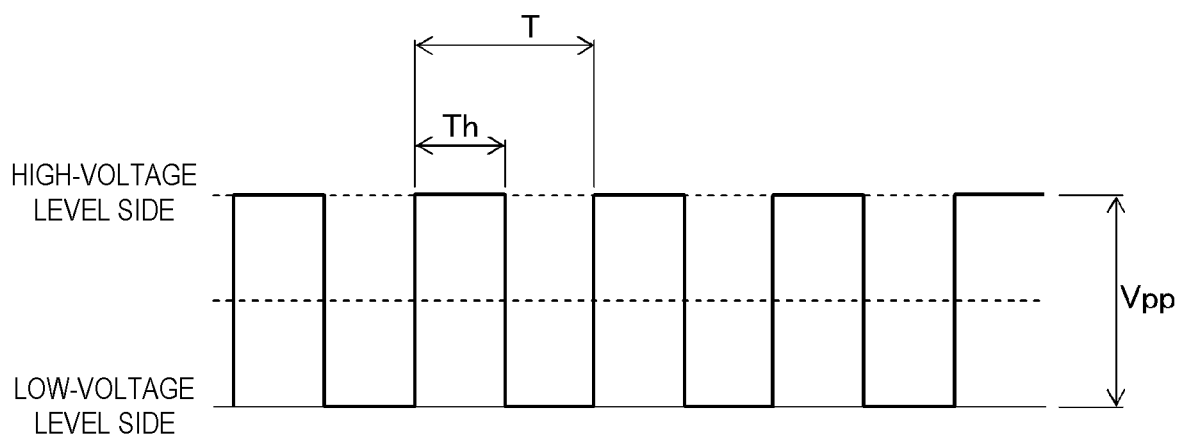
FIG. 23 is a waveform diagram illustrating Exemplary Waveform 5 of the drive voltage applied to the piezoelectric element in the high-load operation.

FIG. 23 illustrates Exemplary Waveform 5 of drive voltage applied to the piezoelectric element during the high-load operation. The high-load operation condition of the piezoelectric element is preferably as follows, for example.

Waveform: square wave (refer to FIG. 23)
Application voltage: Vpp=140 volts [V]
Frequency: 1/T=150 kilohertz [kHz] or higher
Duty: 1.0% to 99.0% inclusive.

Figure 24:
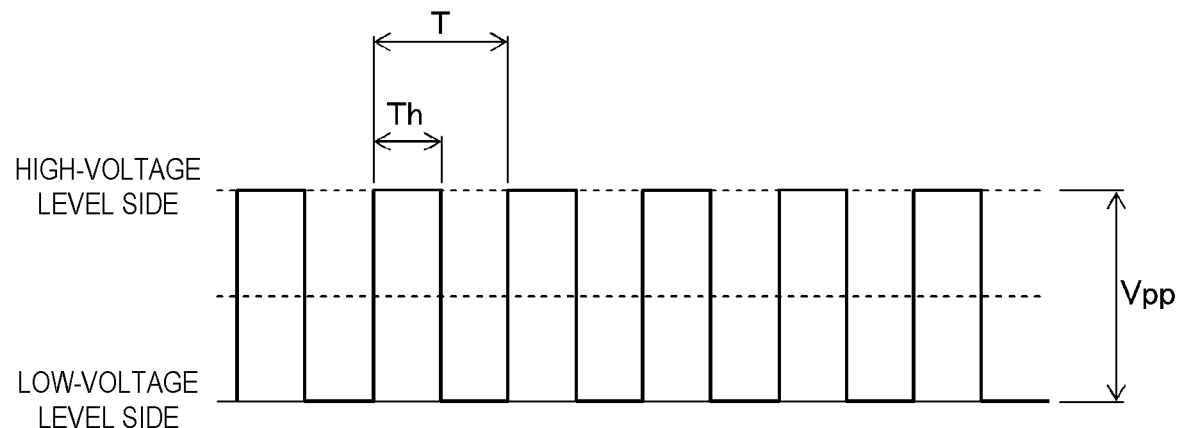
FIG. 24 is a waveform diagram illustrating Exemplary Waveform 6 of the drive voltage applied to the piezoelectric element in the high-load operation.

FIG. 24 illustrates Exemplary Waveform 6 of drive voltage applied to the piezoelectric element during the high-load operation. The high-load operation condition of the piezoelectric element is more preferably as follows, for example.

Waveform: square wave (refer to FIG. 24)
Application voltage: Vpp=140 volts [V]
Frequency: 1/T=170 kilohertz [kHz] or higher
Duty: 1.0% to 99.0% inclusive.

10.3 Specific Example of High-Load Operation Condition that Application Voltage and Frequency are Higher than Rated Operation Condition Alternatively, for example, in the high-load operation condition, a voltage waveform the application voltage and the frequency of which are higher than the rated voltage and the rated frequency of the rated operation condition may be used.

Figure 25:
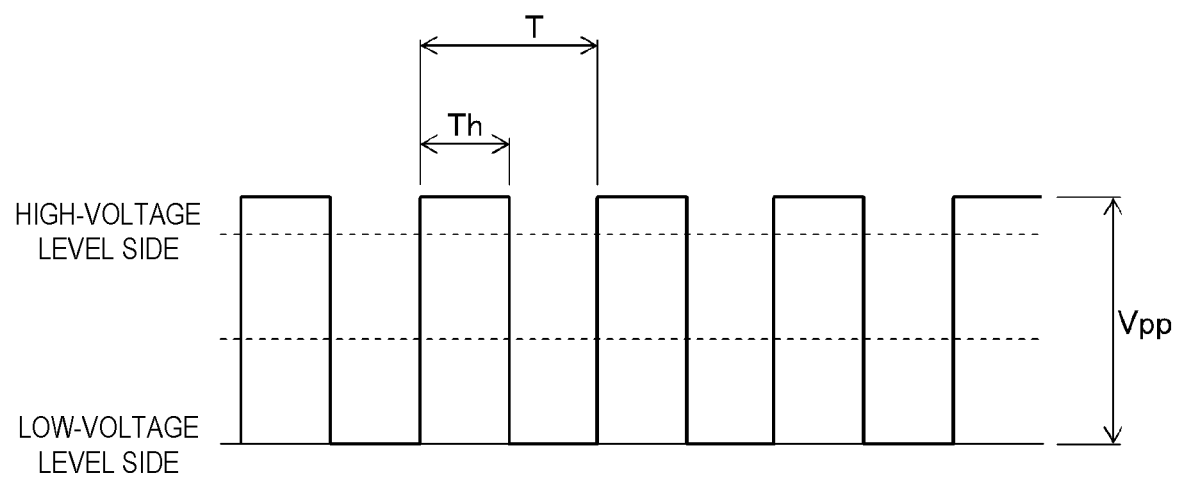
FIG. 25 is a waveform diagram illustrating Exemplary Waveform 7 of the drive voltage applied to the piezoelectric element in the high-load operation.

FIG. 25 illustrates Exemplary Waveform 7 of drive voltage applied to the piezoelectric element during the high-load operation. The high-load operation condition of the piezoelectric element is as follows, for example.

Waveform: square wave (refer to FIG. 25)
Application voltage: Vpp=voltage higher than rated voltage
Frequency: 1/T=frequency higher than rated frequency
Duty: 1.0% to 99.0% inclusive.

11. Laser Apparatus

The laser apparatus 14 may include a pre-pulse laser apparatus configured to output a pre-pulse laser beam, and a main pulse laser apparatus configured to output a main pulse laser beam. In the LPP EUV light generation device 12 in the present embodiment, a target in the form of droplet is diffused through irradiation with a pre-pulse laser beam to form a diffused target, and then the diffused target is irradiated with a main pulse laser beam. When the diffused target is irradiated with the main pulse laser beam in this manner, plasma can be efficiently generated from the target substance. This configuration can improve conversion efficiency (CE) from the energy of the pulse laser beam to the energy of EUV light.

The pre-pulse laser beam for forming a diffused target includes short pulses each having a pulse width shorter than one nanosecond [ns], preferably shorter than 500 picoseconds [ps], more preferably shorter than 50 picoseconds [ps]. In addition, the fluence of each pulse of the pre-pulse laser beam is equal to or smaller than the fluence of each pulse of the main pulse laser beam, and is equal to or larger than 6.5 J/cm$^2$, preferably equal to or larger than 30 J/cm$^2$, more preferably equal to or larger than 45 J/cm$^2$.

With such a configuration, the target can be diffused through breakdown into minute particles by shortening the pulse width of each pulse of the pre-pulse laser beam. Accordingly, when a diffused target is irradiated with the main pulse laser beam, plasma is efficiently generated from the target, which leads to improvement of the CE.

Alternatively, the target may be irradiated with a plurality of pre-pulse laser beams before irradiation with the main pulse laser beam.

The above description is intended to provide not restriction but examples. Thus, the skilled person in the art would clearly understood that the embodiments of the present disclosure may be changed without departing from the scope of the claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". It should be understood that the indefinite article "a" in the present specification and the claims means "at least one" or "one or more".

What is claimed is:

1. An extreme ultraviolet light generation device configured to generate plasma from a target substance by irradiating the target substance with a laser beam to generate extreme ultraviolet light from the plasma, the extreme ultraviolet light generation device comprising:

a chamber in which the generation of the extreme ultraviolet light is performed;
a target supply unit including a nozzle through which the target substance in a liquid form is output into the chamber;
a piezoelectric element configured to vibrate the nozzle under a droplet connection condition to regularly generate a droplet of the target substance; and
a control unit configured to perform search processing of changing a drive condition of the piezoelectric element to search for a drive condition of the piezoelectric element corresponding to the droplet connection condition and configured to set a drive condition of the piezoelectric element used for the generation of the extreme ultraviolet light based on a result of the search processing,
the control unit being configured to preliminarily drive the piezoelectric element before performing the search processing and start the search processing after performing the preliminary drive,
wherein the preliminary drive is a high-load operation in which the piezoelectric element is driven by application, to the piezoelectric element, of a voltage waveform at least one of an application voltage and a frequency of which is higher than the corresponding one of a rated voltage and a rated frequency of a voltage waveform applied to the piezoelectric element during an extreme ultraviolet light generation process in which the extreme ultraviolet light is generated.

2. The extreme ultraviolet light generation device according to claim 1, wherein the application voltage of the voltage waveform applied to the piezoelectric element in the preliminary drive is higher than the rated voltage by 20 V or more.

3. The extreme ultraviolet light generation device according to claim 1, wherein the frequency of the voltage waveform applied to the piezoelectric element in the preliminary drive is higher than the rated frequency by 30 kHz or more.

4. The extreme ultraviolet light generation device according to claim 1, wherein the control unit starts the search processing after performing the preliminary drive for a defined time set in advance or longer.

5. The extreme ultraviolet light generation device according to claim 1, further comprising:
a temperature sensor configured to measure a temperature of the piezoelectric element; and
a temperature determination unit configured to determine whether the temperature of the piezoelectric element matches a defined condition that is defined in advance,
wherein the control unit starts the search processing when the temperature of the piezoelectric element matches the defined condition through the preliminary drive.

6. The extreme ultraviolet light generation device according to claim 1, wherein, when a reference temperature range is an allowable range of a temperature of the piezoelectric element while increase of the temperature of the piezoelectric element during an extreme ultraviolet light generation process in which the extreme ultraviolet light is generated is saturated, the control unit starts the search processing after performing the preliminary drive to increase the temperature of the piezoelectric element to a temperature in the reference temperature range or to a temperature exceeding the reference temperature range.

7. The extreme ultraviolet light generation device according to claim 1, wherein the control unit starts the search processing after increase of a temperature of the piezoelectric element is saturated by performing the preliminary drive.

8. The extreme ultraviolet light generation device according to claim 1, wherein, when a reference temperature range is a range of a temperature of the piezoelectric element while increase of the temperature of the piezoelectric element is saturated during an extreme ultraviolet light generation process in which the extreme ultraviolet light is generated, the control unit starts the search processing before the temperature of the piezoelectric element decreases to a temperature lower than the reference temperature range after the control unit ends the preliminary drive.

9. The extreme ultraviolet light generation device according to claim 1, wherein
the piezoelectric element is driven by application of a voltage waveform of square wave,
the drive condition of the piezoelectric element includes a duty value of the square wave,
the voltage waveform applied to the piezoelectric element in the search processing has an application voltage and a frequency equal to a rated voltage and a rated frequency of a voltage waveform applied to the piezoelectric element during an extreme ultraviolet light generation process in which the extreme ultraviolet light is generated, and
the control unit searches for a duty value corresponding to the droplet connection condition by sequentially changing the duty value of the square wave in the search processing.

10. The extreme ultraviolet light generation device according to claim 1, wherein
a piezoelectric unit constituted by sandwiching the piezoelectric element between a first component and a second component is disposed at the nozzle,
the first component transfers vibration of the piezoelectric element to the nozzle,
the second component presses the piezoelectric element against the first component,
a temperature sensor configured to measure a temperature inside the first component is disposed at the first component, and
temperature information obtained from the temperature sensor is used as information indicating a temperature of the piezoelectric element.

11. An extreme ultraviolet light generation device configured to generate plasma from a target substance by irradiating the target substance with a laser beam to generate extreme ultraviolet light from the plasma, the extreme ultraviolet light generation device comprising:
a chamber in which the generation of the extreme ultraviolet light is performed;
a target supply unit including a nozzle through which the target substance in a liquid form is output into the chamber;
a piezoelectric element configured to vibrate the nozzle under a droplet connection condition to regularly generate a droplet of the target substance; and
a control unit configured to perform search processing of changing a drive condition of the piezoelectric element to search for a drive condition of the piezoelectric element corresponding to the droplet connection condition and configured to set a drive condition of the piezoelectric element used for the generation of the extreme ultraviolet light based on a result of the search processing, the control unit being configured to preliminarily drive the piezoelectric element before performing the search processing and start the search processing after performing the preliminary drive,
wherein the preliminary drive is a rated operation in which the piezoelectric element is driven by application, to the piezoelectric element, of a voltage waveform an application voltage and a frequency of which are equal to a rated voltage and a rated frequency of a voltage waveform applied to the piezoelectric element during an extreme ultraviolet light generation process in which the extreme ultraviolet light is generated.

12. The extreme ultraviolet light generation device according to claim 11, wherein the first component is provided with a cooling water path through which cooling water flows.

13. The extreme ultraviolet light generation device according to claim 11, wherein the control unit starts the search processing after performing the preliminary drive for a defined time set in advance or longer.

14. The extreme ultraviolet light generation device according to claim 11, further comprising:
a temperature sensor configured to measure a temperature of the piezoelectric element; and
a temperature determination unit configured to determine whether the temperature of the piezoelectric element matches a defined condition that is defined in advance,
wherein the control unit starts the search processing when the temperature of the piezoelectric element matches the defined condition through the preliminary drive.

15. The extreme ultraviolet light generation device according to claim 11, wherein, when a reference temperature range is an allowable range of a temperature of the piezoelectric element while increase of the temperature of the piezoelectric element during an extreme ultraviolet light generation process in which the extreme ultraviolet light is generated is saturated, the control unit starts the search processing after performing the preliminary drive to increase the temperature of the piezoelectric element to a temperature in the reference temperature range or to a temperature exceeding the reference temperature range.

16. The extreme ultraviolet light generation device according to claim 11, wherein the control unit starts the search processing after increase of a temperature of the piezoelectric element is saturated by performing the preliminary drive.

17. The extreme ultraviolet light generation device according to claim 11, wherein, when a reference temperature range is a range of a temperature of the piezoelectric element while increase of the temperature of the piezoelectric element is saturated during an extreme ultraviolet light generation process in which the extreme ultraviolet light is generated, the control unit starts the search processing before the temperature of the piezoelectric element decreases to a temperature lower than the reference temperature range after the control unit ends the preliminary drive.

18. The extreme ultraviolet light generation device according to claim 11, wherein
a piezoelectric unit constituted by sandwiching the piezoelectric element between a first component and a second component is disposed at the nozzle,
the first component transfers vibration of the piezoelectric element to the nozzle,
the second component presses the piezoelectric element against the first component,
a temperature sensor configured to measure a temperature inside the first component is disposed at the first component, and
temperature information obtained from the temperature sensor is used as information indicating a temperature of the piezoelectric element.

19. The extreme ultraviolet light generation device according to claim 11, wherein
the piezoelectric element is driven by application of a voltage waveform of square wave,
the drive condition of the piezoelectric element includes a duty value of the square wave,
the voltage waveform applied to the piezoelectric element in the search processing has an application voltage and a frequency equal to a rated voltage and a rated frequency of a voltage waveform applied to the piezoelectric element during an extreme ultraviolet light generation process in which the extreme ultraviolet light is generated, and
the control unit searches for a duty value corresponding to the droplet connection condition by sequentially changing the duty value of the square wave in the search processing.

20. A target supply device comprising:
a tank in which a target substance in a liquid form is housed;
a nozzle that is communicated with the tank and through which the target substance is output;
a piezoelectric element configured to vibrate the nozzle under a droplet connection condition to regularly generate a droplet of the target substance; and
a control unit configured to perform search processing of changing a drive condition of the piezoelectric element to search for a drive condition of the piezoelectric element corresponding to the droplet connection condition and configured to set a drive condition of the piezoelectric element based on a result of the search processing,
the control unit being configured to preliminarily drive the piezoelectric element before performing the search processing and start the search processing after performing the preliminary drive,
wherein the preliminary drive is a high-load operation in which the piezoelectric element is driven by application, to the piezoelectric element, of a voltage waveform at least one of an application voltage and a frequency of which is higher than the corresponding one of a rated voltage and a rated frequency of a voltage waveform applied to the piezoelectric element during an extreme ultraviolet light generation process in which the extreme ultraviolet light is generated.

* * * * *